United States Patent
Phung et al.

(10) Patent No.: US 11,411,158 B2
(45) Date of Patent: Aug. 9, 2022

(54) OFFSET EMBEDDED GROUND PLANE CUTOUT

(71) Applicant: International Business Machines Corporation, Armonk, NY (US)

(72) Inventors: Timothy Phung, Milpitas, CA (US); David Abraham, Croton, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 17/130,376

(22) Filed: Dec. 22, 2020

(65) Prior Publication Data
US 2022/0199886 A1     Jun. 23, 2022

(51) Int. Cl.
| | |
|---|---|
| H01L 39/02 | (2006.01) |
| G06N 10/00 | (2022.01) |
| H01L 39/04 | (2006.01) |
| H01L 39/24 | (2006.01) |
| H01L 39/22 | (2006.01) |

(52) U.S. Cl.
CPC .......... *H01L 39/025* (2013.01); *G06N 10/00* (2019.01); *H01L 39/045* (2013.01); *H01L 39/223* (2013.01); *H01L 39/2493* (2013.01)

(58) Field of Classification Search
CPC ... H01L 39/025; H01L 39/045; H01L 39/223; H01L 39/2493; G06N 10/00
See application file for complete search history.

(56) References Cited

U.S. PATENT DOCUMENTS

| | | | |
|---|---|---|---|
| 4,509,146 A | 4/1985 | Wang et al. | |
| 4,554,567 A | 11/1985 | Jillie et al. | |
| 5,319,307 A | 6/1994 | Simmonds | |
| 8,642,998 B2 | 2/2014 | Gambetta et al. | |
| (Continued) | | | |

FOREIGN PATENT DOCUMENTS

WO     2020169503     8/2020

OTHER PUBLICATIONS

Rosenberg et al., "3D integrated superconducting qubits," npj Quantum Information vol. 3, Article No. 42 (2017), 5 pages.

(Continued)

*Primary Examiner* — Matthew L Reames
(74) *Attorney, Agent, or Firm* — Amin, Turocy & Watson, LLP

(57) ABSTRACT

Techniques for creating an offset embedded ground plane cutout for a qubit device to facilitate frequency tuning of the qubit device are presented. A qubit device can comprise a first substrate and second substrate in a flip-chip assembly. The qubit chip assembly can comprise a qubit component fabricated on the first substrate. The qubit component can comprise a Josephson junction (JJ) circuit that can be offset from a center point of the qubit component. The qubit chip assembly can comprise an embedded ground plane situated on a surface of the qubit chip assembly. A cutout section can be formed in the ground plane and positioned over the JJ circuit. The cutout section can enable access of an optical signal or magnetic flux to the JJ circuit. A frequency of the qubit component can be tuned based on application of the optical signal or magnetic flux to the JJ circuit.

20 Claims, 18 Drawing Sheets
(13 of 18 Drawing Sheet(s) Filed in Color)

(56) References Cited

U.S. PATENT DOCUMENTS

| | | | |
|---|---|---|---|
| 9,059,674 B2 | 6/2015 | Chow et al. | |
| 9,836,699 B1 | 12/2017 | Rigetti et al. | |
| 9,940,586 B1 | 4/2018 | Epstein et al. | |
| 9,971,970 B1 | 5/2018 | Rigetti et al. | |
| 10,134,972 B2 | 11/2018 | Oliver et al. | |
| 10,496,934 B2 | 12/2019 | Rigetti et al. | |
| 10,998,486 B1* | 5/2021 | Martinis | G06N 10/00 |
| 2019/0042967 A1 | 2/2019 | Yoscovits et al. | |
| 2019/0385673 A1 | 12/2019 | Bosman et al. | |
| 2020/0335686 A1* | 10/2020 | Shao | H01L 21/30604 |

OTHER PUBLICATIONS

Yost et al., "Solid-state qubits integrated with superconducting through-silicon vias," arXiv:1912.10942v3 [quant-ph] Sep. 29, 2020, 9 pages.

Dickel, "Scalability and modularity for transmon-based quantum processors," Doctoral Thesis, Delft University of Technology, Sep. 25, 2018, 187 pages.

Luthi et al., "Evolution of Nanowire Transmons and Their Quantum Coherence in Magnetic Field," arXiv:1711.07961v1 [quant-ph] Nov. 21, 2017, 13 pages.

Dunsworth et al., "Characterization and Reduction of Capacitive Loss Induced by Sub-Micron Josephson Junction Fabrication in Superconducting Qubits," arXiv:1706.00879v1 [quant-ph] Jun. 3, 2017, 9 pages.

Kounalakis et al., "Tuneable hopping and nonlinear cross-Kerr interactions in a high-coherence superconducting circuit," arXiv:1802.10037v2 [quant-ph] Aug. 8, 2018, 19 pages.

Barends et al., "Coherent Josephson qubit suitable for scalable quantum integrated circuits," arXiv:1304.2322 [quant-ph], Apr. 8, 2013, 10 pages.

International Search Report and Written Opinion received for PCT Application Serial No. PCT/EP2021/086787 dated Apr. 11, 2022, 14 pages.

Reikebaum et al., "Improving Wafer-scale Josephson Junction Resistance Variation in Superconducting Quantum Coherent Circuits", arXiv: 1909 09165v2 [quant-ph]. May 7, 2020, 10 pages.

Lecocq et al., "Control and Readout of a Superconducting Qubit Using a Photonic Link", arXiv:2009.01167v1 [quant-ph], Sep. 2, 2020, 13 pages.

* cited by examiner

ND ground PLANE CUTOUT

BACKGROUND

The subject disclosure relates to quantum circuitry, and more specifically, to an offset embedded ground plane cutout.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, methods, apparatuses, and/or computer program products that can facilitate creating, designing, and/or utilizing offset circuitry and an embedded ground plane cutout for a qubit device to facilitate frequency tuning of the qubit device are presented.

According to an embodiment, a system can comprise a qubit chip assembly. The qubit chip assembly can comprise a qubit component fabricated on a substrate, wherein the qubit component comprises a Josephson junction circuit that is offset by a defined distance from a center point of the qubit component. The qubit chip assembly also can comprise a ground plane situated on a surface of the qubit chip assembly, wherein a cutout section is formed in, and defined by a remaining portion of, the ground plane and is positioned over the Josephson junction circuit.

Another embodiment relates to a method that can comprise forming a qubit component, comprising Josephson junction circuitry, on a substrate, wherein the Josephson junction circuitry is offset by a defined distance from a center point of the qubit component. The method also can comprise forming a ground plane situated on a surface of a qubit chip package that comprises the qubit component, wherein a cutout section is formed in, and defined by a remaining portion of, the ground plane and is positioned over the Josephson junction circuitry.

A further embodiment relates to a qubit device that can comprise a qubit chip package. The qubit chip package can comprise a qubit component formed on a substrate component, wherein the qubit component comprises a Josephson junction component that is offset by a defined amount from a center region of the qubit component. The qubit chip package also can comprise a ground plane component situated on a surface of the qubit chip package, wherein a cutout portion is formed in, and defined by a remaining portion of, the ground plane component and is situated over the Josephson junction component.

These and other features will become apparent from the following detailed description of illustrative embodiments thereof, which is to be read in connection with the accompanying drawings.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Frequency tunable qubit devices can be useful and desirable in many quantum computing architectures. Frequency tunable qubit devices can be used for parametric operations, or as a tunable coupling device, for example. There can be frequency tunable qubit devices based on Josephson junction circuitry, wherein the qubit device can be tuned by applying an optical signal (e.g., laser signal) to the Josephson junction circuitry of the qubit device. There also can be frequency tunable qubit devices based on superconducting quantum interference devices (SQUIDs), wherein the qubit device can be tuned by applying a magnetic flux to the SQUID loop of the qubit device.

Figure 18:
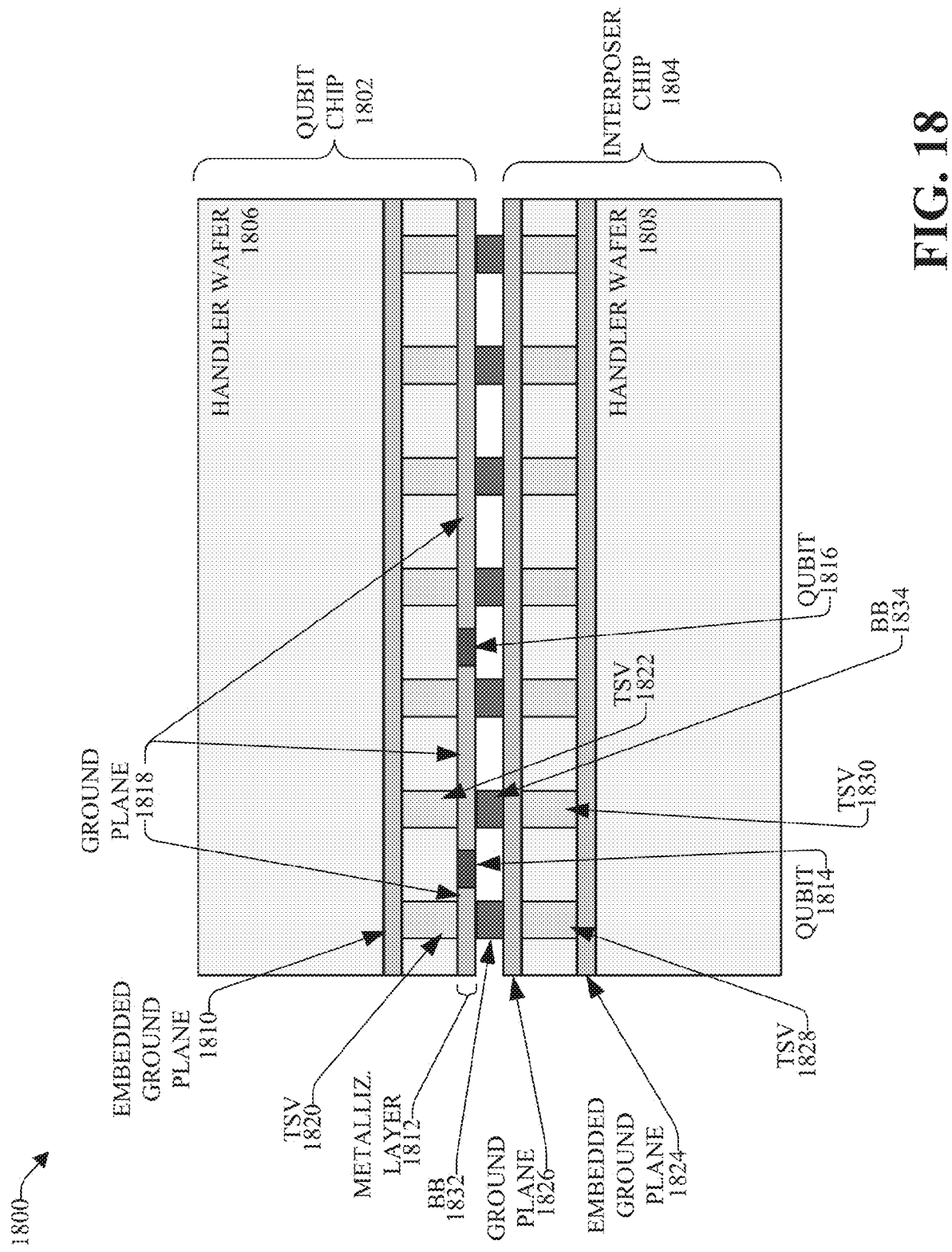
FIG. 18 depicts a diagram of an example qubit device that can comprise a multi-layer package, in accordance with various aspects and embodiments of the disclosed subject matter.

Multi-layer packaging can be employed to scale up multi-qubit devices (e.g., devices comprising multiple qubit components). The multi-layer packaging can comprise chips that can include multiple qubits and associated circuitry that can inserted within a larger assembly (e.g., qubit chip assembly), with the qubit chip and interposer chip containing grounded through silicon vias (TSVs) to desirably suppress chip modes. Referring to FIG. 18, FIG. 18 is a diagram of an example qubit device 1800 that can comprise a multi-layer package, in accordance with various aspects and embodiments of the disclosed subject matter. The example qubit device 1800 can comprise a qubit chip 1802 and an interposer chip 1804. The qubit chip 1802 and interposer chip 1804 each can have desired dimensions (e.g., length, width, and height). A handler wafer 1806 can be associated with the qubit chip 1802, wherein the handler wafer 1806 can have desired dimensions. Another handler wafer 1808 can be associated with the interposer chip 1804, wherein the handler wafer 1808 can have desired dimensions.

The qubit chip 1802 can comprise an embedded ground plane 1810 that can be associated with (e.g., adjacent or attached to) the handler wafer 1806, wherein the embedded ground plane 1810 can be formed of a desired conductive material, such as, for example, a desired superconductive material. On the outer or top surface of the qubit chip 1802, a metallization layer 1812 (e.g., qubit metallization) can be formed or deposited, wherein the metallization layer 1812 can comprise a conductive material, such as, for example, a desired superconductive material. The metallization layer 1812 can be processed (e.g., chemically etched) to form qubits, such as qubit 1814 and qubit 1816, and a ground plane 1818 (e.g., qubit ground plane). A set of TSVs, such as TSV 1820 and TSV 1822, can be formed in the qubit chip 1802 (e.g., can be formed in qubit chip structural material of the qubit chip 1802, wherein the qubit chip structural material can be situated between the embedded ground plane 1810 and the ground plane 1818 as well as qubits 1814 and 1816).

With further regard to the interposer chip 1804, the interposer chip 1804 can comprise an embedded ground plane 1824 that can be associated with (e.g., adjacent or attached to) the handler wafer 1808, wherein the embedded ground plane 1824 can be formed of a desired conductive material, such as, for example, a desired superconductive material. On the outer or top surface of the interposer chip 1804, a ground plane 1826 (e.g., interposer ground plane) can be formed or deposited, wherein the ground plane 1826 can comprise a conductive material, such as, for example, a desired superconductive material. A set of TSVs, such as TSV 1828 and TSV 1830, can be formed in the interposer chip 1804 (e.g., can be formed in interposer chip structural material of the interposer chip 1804, wherein the interposer chip structural material can be situated between the embedded ground plane 1824 and the ground plane 1826).

A set of bump bonds, such as bump bond 1832 and 1834, can be formed between the ground plane 1818 of the qubit chip 1802 and the ground plane 1826 of the interposer chip 1804, for example, in proximity to the locations of the TSVs. The set of bump bonds can connect components on the qubit chip 1802 to components on the interposer chip 1804.

It can be desirable to tune (e.g., adjust) a frequency (e.g., qubit frequency) of qubits of a qubit device to avoid undesirable frequency collisions, which can negatively impact the performance of a quantum computer. The tuning of the frequency of a qubit typically can be performed post-fabrication of the qubit device. Techniques for tuning the qubit frequency can comprise laser tuning or flux tuning. With laser tuning, a laser device can apply an optical pulse (e.g., laser light pulse) to a Josephson junction(s) of the qubit device to adjust the frequency of qubits. With flux tuning, a coil device (e.g., electric coil) can generate a magnetic field, and magnetic flux produced by the magnetic field can be applied to a SQUID loop associated with qubits of a flux frequency-tunable qubit device to adjust the frequency of the qubits.

With multi-layer packaging that employs a flip-chip structure, where the handler wafers associated with the qubit chip and interposer chip of the qubit device can be on the outer regions of the qubit device, and where the qubits can be located in an inner region of the qubit device, it can be unfeasible, impractical, or impossible to adjust the frequency of the qubits using laser tuning or flux tuning techniques due to the presence of a continuous ground plane on the top of the qubit chip. The continuous ground plane (e.g., continuous superconducting ground plane) can prevent or inhibit an optical signal or magnetic flux from penetrating the ground plane and reaching the qubits to enable tuning of the qubits.

It can be desirable to have frequency tunable devices that do not suffer from these and/or other deficiencies. For instance, it can be desirable to create, realize, or develop a frequency tunable qubit device that can be tuned (e.g., tuned post fabrication) in an efficient, practical, and useful way that will not undesirably (e.g., negatively or unduly) impact performance of the qubit device.

To that end, various embodiments described herein relate to techniques for designing, creating, and/or utilizing offset circuitry and an embedded ground plane cutout for a qubit device to facilitate frequency tuning of the qubit device. A qubit device can comprise a first substrate component (e.g., a first handler wafer) and second substrate component (e.g., a second handler wafer) in a flip-chip assembly. The qubit chip assembly can comprise a qubit component formed (e.g., fabricated) on the first substrate component (e.g., on the first substrate component of the qubit chip). The qubit component can comprise a Josephson junction circuit that can be offset by a defined distance from a center point of the qubit component. In some embodiments, the Josephson junction circuit can comprise a SQUID loop. The qubit chip assembly also can comprise an embedded ground plane that can be situated on a surface of the qubit chip assembly, wherein the embedded ground plane can be on the opposite side of the qubit chip from the qubit ground plane, and wherein, the embedded ground plane can be associated with, formed on, or situated on the first substrate component (e.g., a handler wafer component of the qubit chip). A cutout section can be formed in the embedded ground plane and can be positioned over or at least partially over the Josephson junction circuit. The cutout section can have a desired shape and size, such as described herein. In some embodiments, the cutout section can enable access of an optical signal (e.g., optical signal comprising a laser light pulse) to the Josephson junction circuit, wherein an optical signal generator device can generate the optical signal, and wherein a frequency of the qubit component can be tuned (e.g., laser tuned) based at least in part on application of the optical signal to the Josephson junction circuit. In other embodiments, the cutout section can enable access of a magnetic flux to the Josephson junction circuit, wherein a coil device can generate a magnetic field to produce the magnetic flux, and wherein a frequency of the qubit component can be tuned (e.g., flux tuned) based at least in part on application of the magnetic flux to the Josephson junction circuit comprising the SQUID loop.

These and other aspects and embodiments of the disclosed subject matter will now be described with respect to the drawings.

Figure 1:
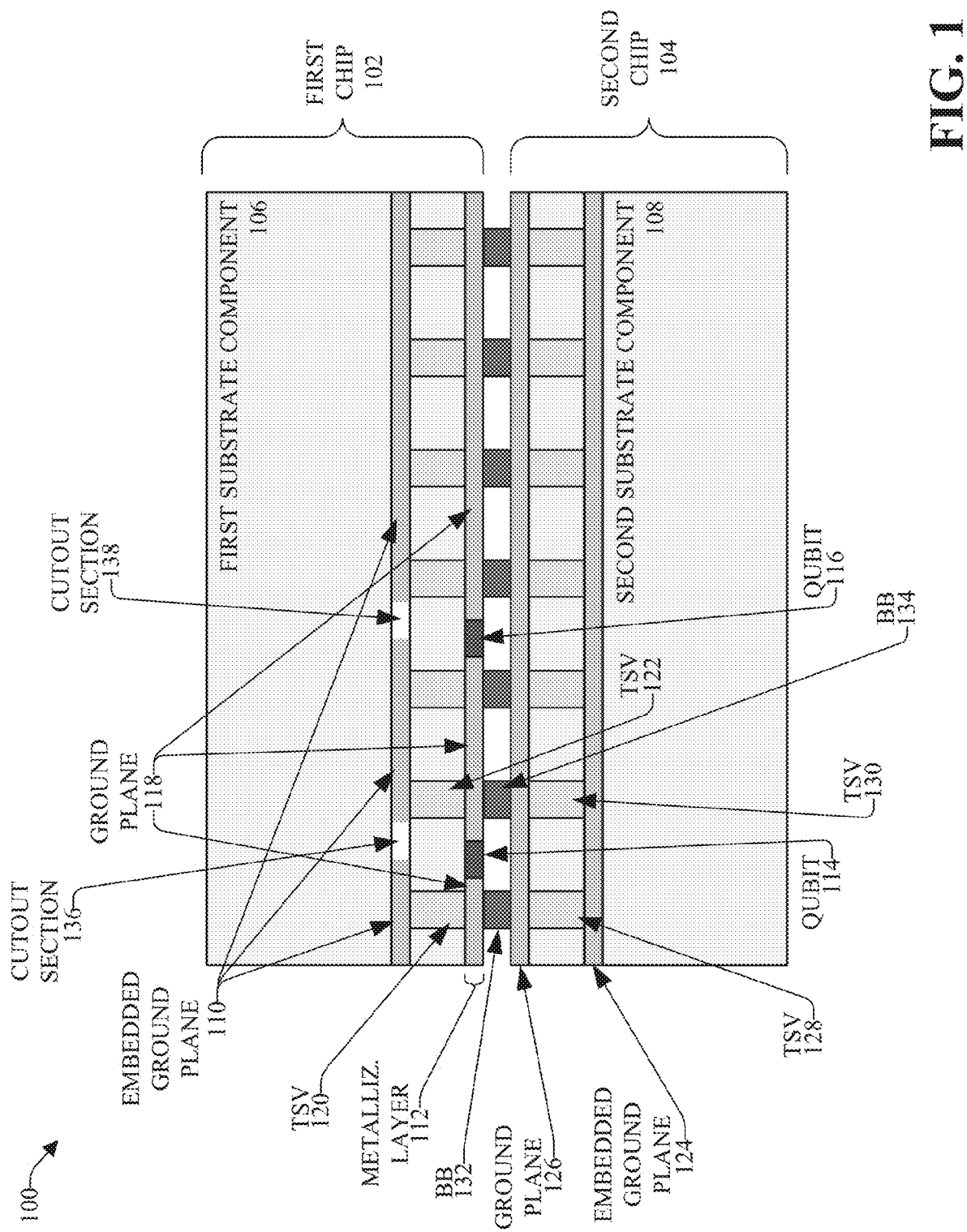
FIG. 1 illustrates a diagram of an example, non-limiting device that can comprise offset circuitry and an offset ground plane cutout to facilitate tuning of a frequency of one or more qubits of the device, in accordance with various aspects and embodiments of the disclosed subject matter.

FIG. 1 illustrates a diagram of an example, non-limiting device 100 that can comprise offset circuitry and an offset ground plane cutout to facilitate tuning of a frequency of one or more qubits of the device 100, in accordance with various aspects and embodiments of the disclosed subject matter. The device 100 can comprise a system of various components and circuitry that can be arranged to perform one or more desired functions. In some embodiments, the device 100 can be or can comprise a qubit device (e.g., a frequency tunable qubit device). In certain embodiments, the device 100 can be a transmon qubit device.

The device 100 can comprise a first chip 102 (e.g., qubit chip) and a second chip 104 (e.g., interposer chip). In some embodiments, the first chip 102 and the second chip 104 can be arranged in relation to each other to form a multi-layer flip-chip package, wherein the second chip 104 can be flipped over (e.g., turned over) such that its top surface, with various components and circuitry formed thereon, can be facing, and in relatively close proximity to, the top surface of the first chip 102, on which various other components and circuitry can be formed. The first chip 102 and second chip 104 each can have desired dimensions (e.g., length, width, and height), wherein at least some of the dimensions (e.g., length, width, and/or height) of the second chip 104 can be the same as or can correspond to at least some of the dimensions (e.g., length, width, and/or height) of the first chip 102. The device 100 (e.g., qubit device, or multi-qubit device or package) can have dimensions that can vary, wherein the length of the device 100 can range, for example, from on the order of millimeters to on the order of tens of millimeters, the width of the device 100 can range, for example, from on the order of millimeters to on the order of tens of millimeters, and the thickness can range, for example, from approximately 1 millimeter (mm) to approximately 3 mm. It is to be appreciated and understood that these dimensions of the device 100 are exemplary, and, in accordance with other embodiments, the device 100 can have different (e.g., smaller or larger) dimensions than the example dimensions described herein.

A first substrate component 106 (also referred to herein as a first handler wafer) can be associated with the first chip 102, wherein the first substrate component 106 can have desired dimensions, and wherein at least some of the dimensions (e.g., length and/or width) of the first substrate component 106 can be the same as or can correspond to at least some of the dimensions (e.g., length and/or width) of the first chip 102. The first substrate component 106 can provide physical support to the first chip 102 and can provide an area or surface(s) on which various components and circuitry of the first chip 102 can be formed, such as described herein. A second substrate component 108 (also referred to as a second handler wafer) can be associated with the second chip 104, wherein the second substrate component 108 can have desired dimensions, and wherein at least some of the dimensions (e.g., length and/or width) of the second substrate component 108 can be the same as or can correspond to at least some of the dimensions (e.g., length and/or width) of the second chip 104. The second substrate component 108 can provide physical support to the second chip 104 and can provide an area or surface(s) on which various components and circuitry of the second chip 104 can be formed, such as described herein. The first substrate component 106 and the second substrate component 108 can be comprise of a desired silicon-based material (e.g., a silicon-type dielectric substrate).

The first chip 102 can comprise an embedded ground plane 110 that can be associated with (e.g., adjacent or attached to) and/or formed on the first substrate component 106, wherein the embedded ground plane 110 can be formed of a desired conductive material, such as, for example, a desired superconductive material (e.g., a niobium-based superconductive material or other superconductive material). The first chip 102 and/or the first substrate component 106 can have dimensions that can vary, wherein the length of the first chip 102 and/or the first substrate component 106 can range, for example, from on the order of millimeters to on the order of tens of millimeters, the width can range, for example, from on the order of millimeters to on the order of tens of millimeters, and the thickness can range, for example, from approximately 100 micrometers (μm) to approximately 1000 μm. It is to be appreciated and understood that these dimensions of the first chip 102 and/or the first substrate component 106 are exemplary, and, in accordance with other embodiments, the first chip 102 and/or the first substrate component 106 can have different (e.g., smaller or larger) dimensions than the example dimensions described herein. On the outer or top surface of the first chip 102, a metallization layer (METALLIZ. LAYER) 112 (e.g., qubit metallization) can be formed or deposited, wherein the metallization layer 112 can comprise a conductive material, such as, for example, a desired superconductive material. The metallization layer 112 can be processed (e.g., chemically etched) to form a set of qubit components, comprising, for example, qubit component (QUBIT) 114 and qubit component 116, and a ground plane 118 (e.g., qubit ground plane), as more fully described herein. A qubit component (e.g., 114 or 116) can have dimensions that can vary, wherein the length of a qubit component can range, for example, from approximately 50 μm to approximately 500 μm, the width of the qubit component can range, for example, from approximately 50 μm to approximately 500 μm, and the thickness of the qubit component can range, for example, from approximately 50 nanometers (nm) to approximately 500 nm. It is to be appreciated and understood that these dimensions of a qubit component (e.g., 114 or 116) are exemplary, and, in accordance with other embodiments, a qubit component can have different (e.g., smaller or larger) dimensions than the example dimensions described herein.

A first set of TSVs, comprising TSV 120 and TSV 122, can be formed in the first chip 102. For instance, the first set of TSVs (e.g., 120, 122) can be formed in structural material (e.g., qubit chip structural material) of the first chip 102, wherein the structural material can be situated between the embedded ground plane 110 and the ground plane 118 as well as qubits 114 and 116, wherein portions of the structural material that remain after the forming of the TSVs (e.g., 120, 122) can surround, and can define the shape and size of, the TSVs, and wherein the TSVs can have desired dimensions (e.g., width and/or height). In accordance with various embodiments, the structural material of the first chip 102 can be or can comprise a same or similar material as the substrate material of the first substrate component 106. The first set of TSVs (e.g., 120, 122) can be useful to suppress or facilitate suppressing chip modes of the first chip 102. Respective qubit components (e.g., 114, 116) typically can be positioned between respective TSVs (e.g., 120, 122).

With further regard to the second chip 104, the second chip 104 can comprise an embedded ground plane 124 that can be associated with (e.g., adjacent or attached to) and/or formed on the second substrate component 108, wherein the embedded ground plane 124 can be formed of a desired conductive material, such as, for example, a desired superconductive material. The second chip 104 and/or the second substrate component 108 can have dimensions that can vary, wherein the length of the second chip 104 and/or the second substrate component 108 can range, for example, from on the order of millimeters to on the order of tens of millimeters, the width can range, for example, from on the order of millimeters to on the order of tens of millimeters, and the thickness can range, for example, from approximately 100 μm to approximately 1000 μm. It is to be appreciated and understood that these dimensions of the second chip 104 and/or the second substrate component 108 are exemplary, and, in accordance with other embodiments, the second chip 104 and/or the second substrate component 108 can have different (e.g., smaller or larger) dimensions than the example dimensions described herein. On the outer or top surface of the second chip 104, a ground plane 126 (e.g., interposer ground plane) can be formed or deposited, wherein the ground plane 126 can comprise a conductive material, such as, for example, a desired superconductive material.

A second set of TSVs, comprising TSV 128 and TSV 130, can be formed in the second chip 104. For instance, the second set of TSVs (e.g., 128, 130) can be formed in structural material (e.g., interposer chip structural material) of the second chip 104, wherein such structural material can be situated between the embedded ground plane 124 and the ground plane 126, wherein portions of the structural material that remain after the forming of the TSVs (e.g., 128, 130) can surround, and can define the shape and size of, the TSVs, and wherein the TSVs can have desired dimensions (e.g., width and/or height). In accordance with various embodiments, the structural material of the second chip 104 can be or can comprise a same or similar material as the substrate material of the second substrate component 108. The second set of TSVs (e.g., 128, 130) can be useful to suppress or facilitate suppressing chip modes of the second chip 104.

In some embodiments, a set of bump bond components (BB), comprising, for example, bump bond component 132 and bump bond component 134, can be formed between the ground plane 118 of the first chip 102 and the ground plane 126 of the second chip 104, for example, in proximity to the locations of respective TSVs of the first set of TSVs (e.g., TSV 120, TSV 122, and/or other TSVs) and the second set of TSVs (e.g., TSV 128, TSV 130, and/or other TSVs). The set of bump bond components (e.g., 132, 134) can connect or facilitate connection of components on the first chip 102 to components on the second chip 104.

It can be desirable to tune (e.g., adjust or modify) a frequency of the device 100. It can be desirable to be able to tune a qubit component(s) of a qubit device after fabrication of a qubit device. In some embodiments, laser tuning can be performed by having a laser device apply an optical signal (e.g., a laser or light signal comprising a laser or light pulse) of a desired wavelength to Josephson junction circuitry (e.g., Josephson junction component(s)) of the qubit component(s) of the qubit device, and the frequency of the qubit component(s) can be tuned (e.g., adjusted or modified) to a desire frequency based at least in part on the application of the optical signal to the Josephson junction circuitry of the qubit component(s). For example, the optical signal can comprise an infrared or other non-visible laser or light pulse that can have a wavelength in the infrared or non-visible light spectrum. In other embodiments, the Josephson junction circuitry of a qubit component(s) (e.g., a flux tunable qubit) of a qubit device can comprise a SQUID component (e.g., a SQUID loop) of a coupler component (e.g., qubit/coupler device). A flux coil can apply a desired amount of magnetic flux to the SQUID component, and the frequency of the qubit component(s) can be tuned (e.g., adjusted or modified) based at least in part on the amount of magnetic flux that is applied to the SQUID component. Laser tuning or flux tuning of qubit devices can desirably reduce frequency collisions in packaged multi-qubit devices and can ease accuracy constraints (e.g., specifications or requirements) for targeting qubit frequencies, which can be particularly challenging to satisfy (e.g., meet) as the number of qubits on multi-qubit devices is scaled up. In a traditional multi-layered qubit package structure, qubits are not able to be frequency adjusted, or at least are not able to be desirably (e.g., suitably, sufficiently, or optimally) adjusted, by either laser tuning or flux tuning techniques due to the presence of the continuous ground plane (e.g., embedded ground plane) on the top of the qubit chip (e.g., the continuous superconducting ground plane can prevent the optical signal or magnetic flux from penetrating through such ground plane to enable application of the optical signal or magnetic flux to the Josephson junction circuitry of the qubit).

In accordance with various embodiments, the disclosed subject matter (e.g., employing a device formation component, such as described herein) can form a cutout section (e.g., an open section or region) in the embedded ground plane 110 of the first chip 102 (e.g., by removal of a portion of the conductive material of the embedded ground plane 110) to enable (e.g., allow) optical access of an optical signal, or magnetic flux penetration, to the Josephson junction circuitry of the qubit components (e.g., 114, 116) of the device 100 to facilitate tuning (e.g., laser tuning or flux tuning) of the qubit components of the device 100. It is noted though that, if the cutout section in the embedded ground plane 110 and other features of a qubit device are not structured properly, the forming of a cutout section in an embedded ground plane of a qubit chip potentially can undesirably provide another path for energy to undesirably leak away from a qubit to the handler wafer and/or can result in undesirable crosstalk between qubits of the device (e.g., multi-qubit device). The transmission of electromagnetic energy from the qubit to the handler wafer (e.g., $S_{21}$) can be undesirably enhanced (e.g., increased) at frequencies that can correspond to chip modes in the handler wafer of the qubit chip, and can increase as the cutout size of the cutout section in the embedded ground plane increases, which can saturate for cutout sizes above approximately 200 µm. While decreasing the size of a cutout section in the embedded ground plane below 200 µm can attenuate qubit-to-handler transmission, decreasing the size of a cutout section can undesirably reduce optical access efficiency of application of an optical signal to Josephson junction circuitry of qubits and can undesirably reduce mutual inductance of the flux coil to the qubit device.

In accordance with various embodiments, the disclosed subject matter can desirably (e.g., properly, suitably, or optimally) form and structure a cutout section (e.g., offset cutout section), such as cutout section 136 and cutout section 138, in the embedded ground plane 110 and other features of a qubit device to enable desirable tuning of qubit components (e.g., 114, 116) of the qubit device, while mitigating (e.g., reducing or minimizing) undesirable transmission of electromagnetic energy from qubits to the handler wafer and undesirable crosstalk between qubits. The disclosed subject matter also can offset Josephson junction circuitry (e.g., Josephson junction component(s) or SQUID component (e.g., SQUID loop)) of the qubit components (e.g., 114, 116), which along with the cutout section (e.g., 136, 138) positioned over the offset Josephson junction circuitry for each qubit component (e.g., 114, 116), can enable desirable tuning of the qubit component (e.g., 114, 116) of the device 100, while mitigating (e.g., reducing or minimizing) undesirable transmission of electromagnetic energy from qubits to the handler wafer and undesirable crosstalk between qubits, as more fully described herein.

It is to be appreciated and understood that, while the device 100 only depicts two cutout sections, including cutout section 136 and 138 formed in the embedded ground plane 110, the disclosed subject matter is not so limited, and, in accordance with various embodiments, the device 100 can comprise a desired number of cutout sections formed in the embedded ground plane 110, for example, to correspond with and be respectively associated with respective qubit components formed on the device 100.

Figure 2:
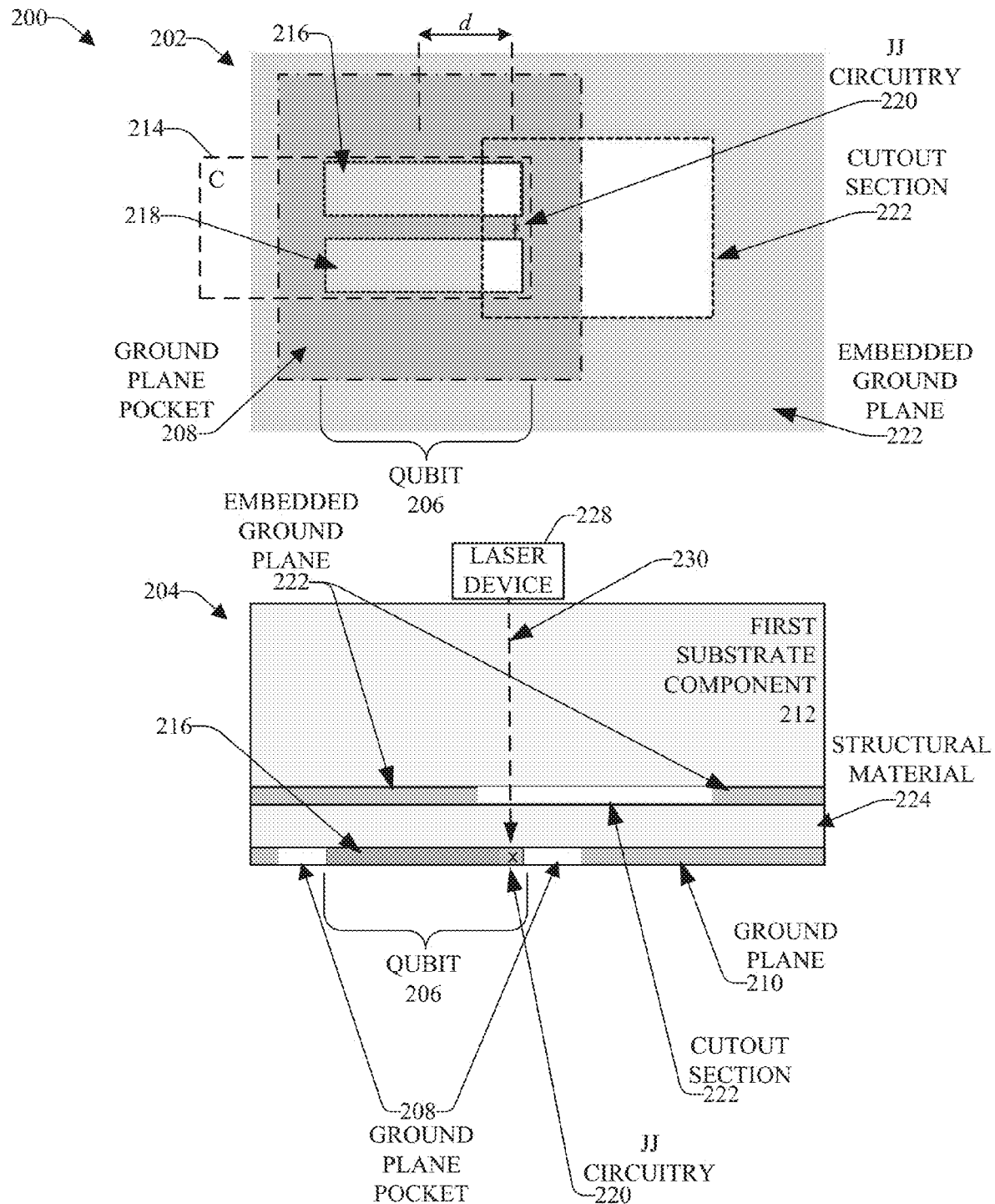
FIG. 2 depicts a diagram of a top view and a side view of an example portion of a first chip (e.g., qubit chip) that can comprise a qubit component that has offset Josephson junction circuitry and an offset cutout section in an embedded ground plane to facilitate laser tuning of the Josephson junction circuitry of the qubit component, in accordance with various aspects and embodiments of the disclosed subject matter.

Referring to FIG. 2 (along with FIG. 1), FIG. 2 depicts a diagram of a top view (e.g., top cross-sectional view) and a side view (e.g., side cross-sectional view) of an example portion of a first chip 200 (e.g., qubit chip) that can comprise a qubit component that has offset Josephson junction circuitry and an offset cutout section in an embedded ground plane to facilitate laser tuning of the Josephson junction circuitry of the qubit component, in accordance with various aspects and embodiments of the disclosed subject matter. For reasons of brevity and clarity, only certain components and features of the qubit chip and qubit component are illustrated in FIG. 2. FIG. 2 presents a top view 202 of the portion of the first chip 200, and a side view 204 of the portion of the first chip 200.

The first chip 200 (e.g., portion of the first chip 200) can comprise a qubit component 206 that can be formed in a ground plane pocket 208 that can be formed in a ground plane 210 (e.g., portion of the qubit ground plane) of the first chip 200. The qubit component 206, ground plane pocket 208, and ground plane 210 can be formed on and/or from a metallization layer, which can be formed and processed (e.g., etched) on a first substrate component 212 (e.g., first handler wafer) of or associated with the first chip 200. The metallization layer, and the qubit component 206 (in part) and ground plane 210, can be formed of a desired conductive material, such as, for example, a desired superconductive material. The first substrate component 212 can be comprised of a desired silicon-based material. The ground plane pocket 208 can have desired dimensions (e.g., length, width, and/or depth), which can span an area on the order of micrometers, can be larger than the size of the qubit component 206, and can surround the qubit component 206 to facilitate desirable formation of the components of the qubit component 206 and desirable isolation of the qubit component 206 from other components of the qubit device. The first chip 200 can be substantially the same as the first chip 102 of FIG. 1, except as described and modified herein, to desirably enable tuning (e.g., laser tuning) of qubits (e.g., qubit component 206) of the qubit device.

The qubit component 206 can comprise a capacitor component (C) 214 (e.g., qubit capacitor), which can include or be associated with capacitor paddle components 216 and 218 that can have desirable dimensions (e.g., length, width, and height). The capacitor paddle component 216 and the capacitor paddle component 218 can be separated from each other with a desired amount of space (e.g., on the order of micrometers) between them. The qubit component 206 also can comprise Josephson junction circuitry, which can comprise a Josephson junction component 220, wherein the ends (e.g., respective terminals) of the Josephson junction component 220 can be respectively associated with (e.g., electrically connected to) the capacitor paddle components 216 and 218. Traditionally, a Josephson junction can be situated (e.g., positioned) in a central area of the capacitor paddles of a qubit capacitor (e.g., Josephson junction can be situated halfway along the length of the capacitor paddles). In some embodiments, the disclosed subject matter (e.g., employing a device formation component) can form the Josephson junction circuitry, comprising the Josephson junction component 220, to be desirably offset by a defined distance (d) from the center of the capacitor paddle components 216 and 218 such that the Josephson junction circuitry, including the Josephson junction component 220, can be located (e.g., positioned) at or near the ends of the capacitor paddle components 216 and 218 on one side of the capacitor paddle components 216 and 218), in accordance with the defined qubit device formation criteria. In accordance with various embodiments, the defined distance (c) of the offset can range, for instance, from approximately 200 µm to 800 µm. For example, a desirable defined distance (c) of the offset can be approximately 300 µm. In certain embodiments, the Josephson junction circuitry can be capacitively shunted Josephson junction circuitry. The disclosed subject matter, by offsetting the Josephson junction circuitry, comprising the Josephson junction component 220, by a desired distance from the center (e.g., qubit center) of the qubit component 206 and the center of the capacitor paddle components 216 and 218, and along the length of the capacitor paddle components 216 and 218, can desirably place the Josephson junction circuitry further away from the capacitor component 214 and other components of the qubit component 206, in accordance with the defined qubit device formation criteria.

The first chip 200 also can comprise an embedded ground plane 222 that can be associated with (e.g., adjacent or attached to) and/or formed on the first substrate component 212, wherein the embedded ground plane 222 can be formed of a desired conductive material, such as, for example, a desired superconductive material. The embedded ground plane 222 can be a surface (e.g., embedded surface) of the qubit chip assembly (also referred to as qubit chip package) of the qubit device. The qubit components, including qubit component 206 and ground plane 210 formed from the metallization layer can be located on the opposite surface of the qubit chip assembly. Structural material 224 (e.g., qubit chip structural material), which can comprise the same or similar material as the first substrate component 212, can be situated between the embedded ground plane 222 and the qubit component 206, ground plane pocket 208, and ground plane 210. The embedded ground plane 222 can therefore be situated (e.g., embedded) between the structural material 224 and the first substrate component 212.

In certain embodiments, the disclosed subject matter (e.g., employing the device formation component) can form a cutout section 226 in the embedded ground plane 222, wherein the cutout section 226 can have desired dimensions (e.g., length and width), in accordance with the defined qubit device formation criteria. In some embodiments, the disclosed subject matter (e.g., employing the device formation component) can form the cutout section 226 to have a desired length that can be greater than approximately 200 µm), in accordance with the defined qubit device formation criteria. When forming the cutout section 226, the disclosed subject matter (e.g., employing the device formation component) can desirably offset the cutout section 226, relative to the position of the qubit component 206, and particularly, relative to the position of the capacitor component 214, by a desired distance such that the cutout section 226 can be positioned over the offset Josephson junction circuitry, including the Josephson junction component 220 (e.g., positioned over at least a portion of the Josephson junction circuitry). For instance, the disclosed subject matter can offset the location of the cutout section 226 in the embedded ground plane 222 and can offset the location of the Josephson junction circuitry, including the Josephson junction component 220, relative to the position of the qubit component 206, and particularly, relative to the position of the capacitor component 214 such that the exposure of the capacitor component 214, the capacitor paddle components 216 and 218, and/or other components of the qubit component 206 to the cutout section 226 and the first substrate component 212 (e.g., first handler wafer) can be desirably reduced or minimized, which can reduce or minimize the amount of energy leaking from the qubit component 206 to the first substrate component 212 and/or can reduce or minimize crosstalk between the qubit component 206 and another qubit component(s) (not shown in FIG. 2) of the qubit device (e.g., multi-qubit device). For instance, the remaining portion of the embedded ground plane 222 can be positioned over and/or cover a desired portion (e.g., most) of the capacitor component 214, including a desired portion (e.g., most) of the capacitor paddle components 216 and 218, which can desirably reduce or minimize the amount of energy leaking from the qubit component 206 to the first substrate component 212 and/or can reduce or minimize crosstalk between the qubit component 206 and another qubit component(s) of the qubit device. Accordingly, qubit handler coupling can be desirably suppressed (e.g., reduced or minimized). Also, crosstalk between qubit components (e.g., qubit component 206 and an adjacent qubit component(s)) can be desirably suppressed (e.g., reduced or minimized) to substantially same level as when there is no cutout section present (e.g., when there is a continuous embedded ground plane). In some embodiments, the cutout section 226 can be offset with regard to the Josephson junction circuitry, including being offset with regard to the Josephson junction component 220, such that a portion of the cutout section 226 near a side (e.g., edge) of the cutout section 226 can be positioned over the Josephson junction circuitry (e.g., the Josephson junction component 220) with another portion (e.g., a relatively larger portion) of the cutout section 226 being positioned over the ground plane pocket 208 adjacent to the qubit component 206.

In certain embodiments, to facilitate tuning the frequency of the qubit component 206, a laser device 228 can be utilized. The laser device 228 can generate and emit an optical signal 230 (e.g., a laser or light signal comprising a laser or light pulse), which can have a desired wavelength, such as described herein. The laser device 228 can apply the optical signal 230 to the Josephson junction circuitry, including the Josephson junction component 220, via the optical access that can be available through the cutout section 226 in the embedded ground plane 222. For instance, the optical signal 230 can pass through the first substrate component 212, the cutout section 226 in the embedded ground plane 222, and the structural material 224 between the embedded ground plane 222 and ground plane 210, and can be applied to the Josephson junction circuitry, including the Josephson junction component 220. The frequency of the qubit component 206 can be desirably (e.g., suitably or optimally) tuned or adjusted based at least in part on the application of the optical signal 230 to the Josephson junction circuitry, including the Josephson junction component 220.

Figure 3:
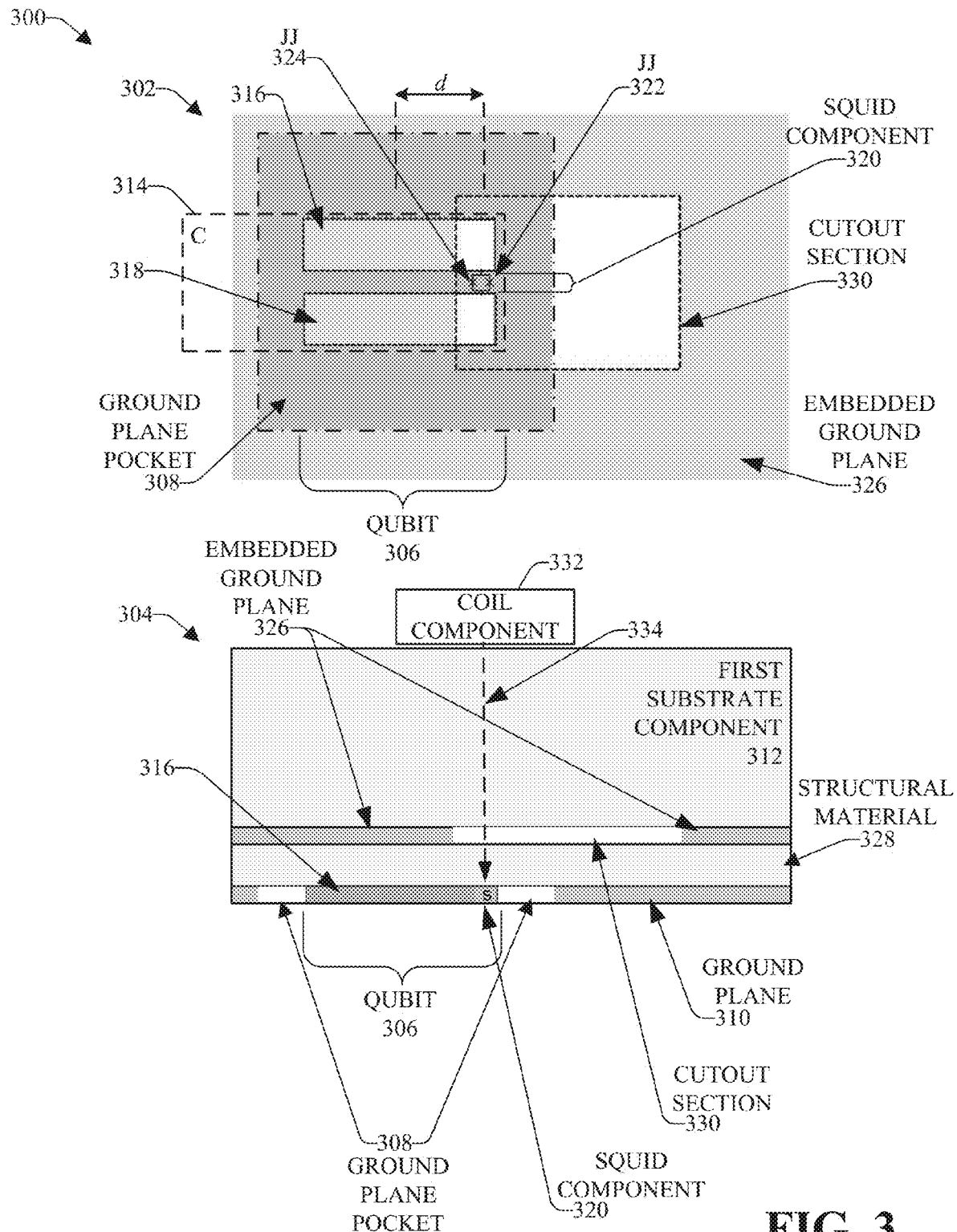
FIG. 3 illustrates a diagram of a top view and a side view of an example portion of a first chip (e.g., qubit chip) that can comprise a qubit component that has offset Josephson junction circuitry, comprising a superconducting quantum interference device (SQUID) component, and an offset cutout section in an embedded ground plane to facilitate flux tuning of the qubit component, in accordance with various aspects and embodiments of the disclosed subject matter.

Turning to FIG. 3 (along with FIG. 1), FIG. 3 illustrates a diagram of a top view (e.g., top cross-sectional view) and a side view (e.g., side cross-sectional view) of an example portion of a first chip 300 (e.g., qubit chip) that can comprise a qubit component that has offset Josephson junction circuitry, comprising a SQUID component, and an offset cutout section in an embedded ground plane to facilitate flux tuning of the qubit component, in accordance with various aspects and embodiments of the disclosed subject matter. For reasons of brevity and clarity, only certain components and features of the qubit chip and qubit component are illustrated in FIG. 3. FIG. 3 presents a top view 302 of the portion of the first chip 300, and a side view 304 of the portion of the first chip 300.

The first chip 300 (e.g., portion of the first chip 300) can comprise a qubit component 306 that can be formed in a ground plane pocket 308 that can be formed in a ground plane 310 (e.g., portion of the qubit ground plane) of the first chip 300. The qubit component 306, ground plane pocket 308, and ground plane 310 can be formed on and/or from a metallization layer, which can be formed and processed (e.g., chemically etched) on a first substrate component 312 (e.g., first handler wafer) of or associated with the first chip 300. The metallization layer, and the qubit component 306 (in part) and ground plane 310, can be formed of a desired conductive material, such as, for example, a desired superconductive material. The first substrate component 312 can be comprised of a desired silicon-based material. The ground plane pocket 308 can have desired dimensions (e.g., length, width, and/or depth), which can span an area on the order of micrometers, can be larger than the size of the qubit component 306, and can surround the qubit component 306 to facilitate desirable isolation of the qubit component 306 from other components of the qubit device. The example portion of the first chip 300 can be substantially the same as the first chip 102 of FIG. 1 and the portion of the first chip 200 of FIG. 2, except as described and modified herein, including, for example, that the portion of the first chip 300 can comprise a SQUID component (e.g., SQUID loop) and can desirably enable tuning (e.g., flux tuning) of qubits (e.g., qubit component 306) of the qubit device.

The qubit component 306 can comprise a capacitor component 314 (e.g., qubit capacitor), which can include or be associated with capacitor paddle components 316 and 318 that can have desirable dimensions (e.g., length, width, and height). The capacitor paddle component 316 and the capacitor paddle component 318 can be separated from each other with a desired amount of space (e.g., on the order of micrometers) between them. The qubit component 306 also can comprise Josephson junction circuitry, which can comprise a SQUID component (S) 320 (e.g., SQUID loop), wherein the SQUID component 320 can comprise at least two Josephson junction components, including a Josephson junction component (JJ) 322 and Josephson junction component 324, and wherein the ends (e.g., respective terminals) of the SQUID component 320 can be respectively associated with (e.g., electrically connected to) the capacitor paddle components 316 and 318. Traditionally, Josephson junction circuitry, including a SQUID loop, can be situated (e.g., positioned) in a central area of the capacitor paddles of a qubit capacitor (e.g., SQUID loop can be situated halfway along the length of the capacitor paddles). In some embodiments, the disclosed subject matter (e.g., employing a device formation component) can form the Josephson junction circuitry, comprising the SQUID component 320, to be desirably offset by a defined distance (d) from the center of the capacitor paddle components 316 and 318 such that the Josephson junction circuitry, including the SQUID component 320, can be located (e.g., positioned) at or near the ends of the capacitor paddle components 316 and 318 on one side of the capacitor paddle components 316 and 318), in accordance with the defined qubit device formation criteria. The disclosed subject matter, by offsetting the Josephson junction circuitry, comprising the SQUID component 320, by a desired distance from the center (e.g., qubit center) of the qubit component 306 and the center of the capacitor paddle components 316 and 318, and along the length of the capacitor paddle components 316 and 318, can desirably place the Josephson junction circuitry further away from the capacitor component 314 and other components of the qubit component 306, in accordance with the defined qubit device formation criteria.

The first chip 300 also can comprise an embedded ground plane 326 that can be associated with (e.g., adjacent or attached to) and/or formed on the first substrate component 312, wherein the embedded ground plane 326 can be formed of a desired conductive material, such as, for example, a desired superconductive material. The embedded ground plane 326 can be a surface (e.g., embedded surface) of the qubit chip assembly or qubit chip package of the qubit device. The qubit components, including qubit component 306 and ground plane 310 formed from the metallization layer can be located on the opposite surface of the qubit chip assembly or qubit chip package. Structural material 328 (e.g., qubit chip structural material), which can comprise the same or similar material as the first substrate component 312, can be situated between the embedded ground plane 326 and the qubit component 306, ground plane pocket 308, and ground plane 310. The embedded ground plane 326 can therefore be situated (e.g., embedded) between the structural material 328 and the first substrate component 312.

In certain embodiments, the disclosed subject matter (e.g., employing the device formation component) can form a cutout section 330 in the embedded ground plane 326, wherein the cutout section 330 can have desired dimensions (e.g., length and width), in accordance with the defined qubit device formation criteria. In some embodiments, the disclosed subject matter (e.g., employing the device formation component) can form the cutout section 330 to have a desired length that can be greater than approximately 200 μm), in accordance with the defined qubit device formation criteria. When forming the cutout section 330, the disclosed subject matter (e.g., employing the device formation component) can desirably offset the cutout section 330, relative to the position of the qubit component 306, and particularly, relative to the position of the capacitor component 314, by a desired distance such that the cutout section 330 can be positioned over (e.g., centered or substantially centered over) the offset Josephson junction circuitry, including the SQUID component 320. For instance, the disclosed subject matter can offset the location of the cutout section 330 in the embedded ground plane 326 and can offset the location of the Josephson junction circuitry, including the SQUID component 320, relative to the position of the qubit component 306 (e.g., relative to the center region of the qubit component 306), and particularly, relative to the position of the capacitor component 314 such that the exposure of the capacitor component 314, the capacitor paddle components 316 and 318, and/or other components of the qubit component 306 to the cutout section 330 and the first substrate component 312 (e.g., first handler wafer) can be desirably reduced or minimized, which can reduce or minimize the amount of energy leaking from the qubit component 306 to the first substrate component 312 and/or can reduce or minimize crosstalk between the qubit component 306 and another qubit component(s) (not shown in FIG. 3) of the qubit device (e.g., multi-qubit device). For instance, the remaining portion of the embedded ground plane 326 can be positioned over and/or cover a desired portion (e.g., most) of the capacitor component 314, including a desired portion (e.g., most) of the capacitor paddle components 316 and 318, which can desirably reduce or minimize the amount of energy leaking from the qubit component 306 to the first substrate component 312 and/or can reduce or minimize crosstalk between the qubit component 306 and another qubit component(s) of the qubit device. Accordingly, qubit handler coupling can be desirably suppressed (e.g., reduced or minimized). Also, crosstalk between qubit components (e.g., qubit component 306 and an adjacent qubit component(s)) can be desirably suppressed (e.g., reduced or minimized) to substantially same level as when there is no cutout section present (e.g., when there is a continuous embedded ground plane). In some embodiments, the cutout section 330 formed in the embedded ground plane 326 can be offset with regard to (e.g., relative to) the Josephson junction circuitry, including being offset with regard to the SQUID component 320, such that a portion of the cutout section 330 near a side (e.g., edge) of the cutout section 330 can be positioned over the Josephson junction circuitry (e.g., the SQUID component 320) with another portion (e.g., a relatively larger portion) of the cutout section 330 being positioned over the ground plane pocket 308 adjacent to the qubit component 306.

In certain embodiments, to facilitate tuning the frequency of the qubit component 306, a coil component 332 (e.g., flux coil) can be utilized. The coil component 332 can generate and emit a desired amount of magnetic flux 334. The coil component 332 can apply the magnetic flux 334 to the Josephson junction circuitry, including the SQUID component 320, via the flux access that can be available through the cutout section 330 formed in the embedded ground plane 326. For instance, the magnetic flux 334 can pass through (e.g., permeate) the first substrate component 312, the cutout section 330 formed in the embedded ground plane 326, and the structural material 328 between the embedded ground plane 326 and ground plane 310, and can thereby be applied to the Josephson junction circuitry, including the SQUID component 320. The frequency of the qubit component 306 can be desirably (e.g., suitably or optimally) tuned or adjusted based at least in part on the application of the magnetic flux 334 to the Josephson junction circuitry, including the SQUID component 320.

Figure 4:
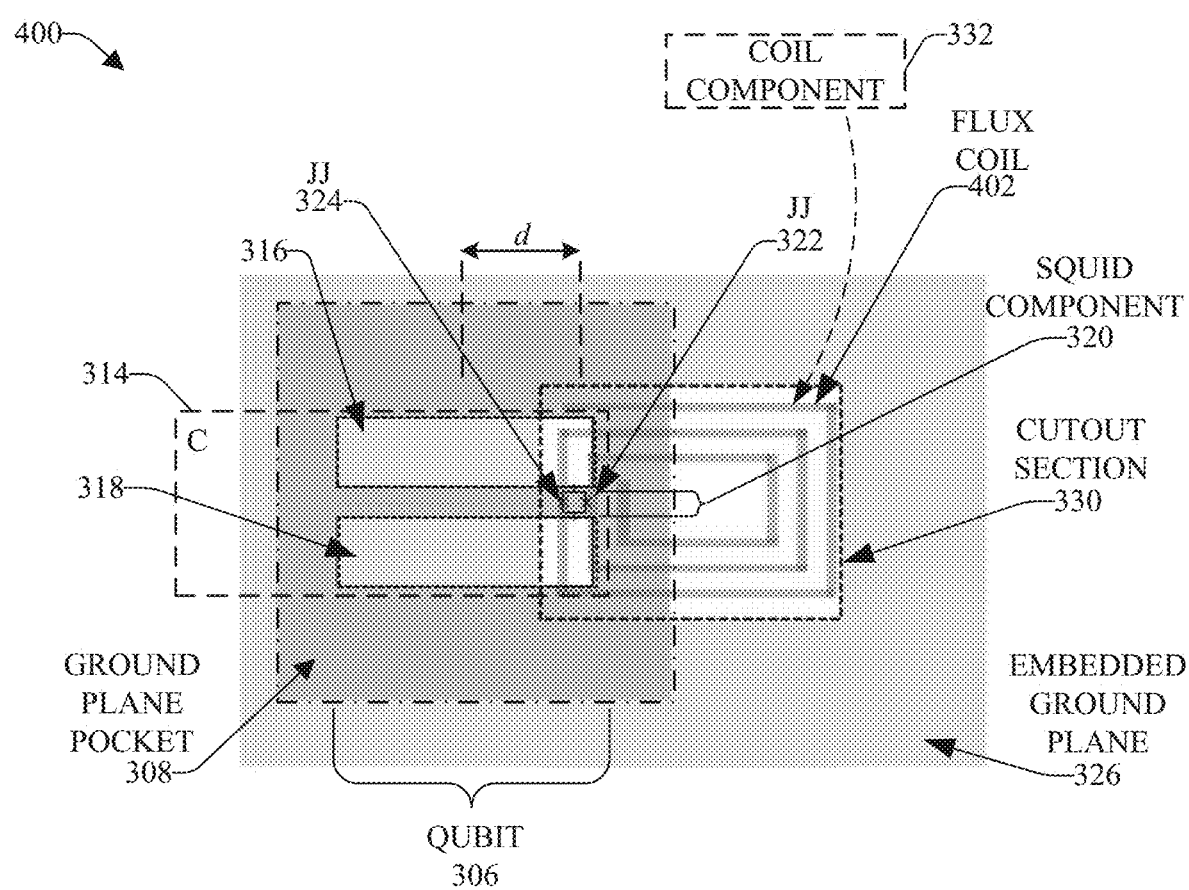
FIG. 4 depicts a diagram of a top view of an example portion of the first chip (e.g., qubit chip) where a flux coil can be placed over the offset cutout section in the embedded ground plane of the qubit chip to facilitate flux tuning of the qubit component, in accordance with various aspects and embodiments of the disclosed subject matter.

Referring to FIG. 4 (along with FIGS. 1 and 3), FIG. 4 depicts a diagram of a top view 400 (e.g., top cross-sectional view) of an example portion of the first chip 300 (e.g., qubit chip) where a flux coil can be placed over the offset cutout section in the embedded ground plane of the qubit chip to facilitate flux tuning of the qubit component, in accordance with various aspects and embodiments of the disclosed subject matter. For reasons of brevity and clarity, only certain components and features of the qubit chip and qubit component are illustrated in FIG. 4.

In some embodiments, the coil component 332 (e.g., external coil component) can comprise a flux coil 402 that can be centered over the cutout section 330 formed in the embedded ground plane 326. For instance, the flux coil 402 can be a concentric flux coil that can be concentric with the cutout section 330 formed in the embedded ground plane 326, wherein the coil component 332 can generate the desired magnetic flux 334 and can apply the magnetic flux 334 to the SQUID component 320 (e.g., SQUID loop). By employing a flux coil 402 that can be concentric with the cutout section 330 formed in the embedded ground plane 326 and positioned over the SQUID component 320 (e.g., offset SQUID loop), the flux coil 402 can produce a desirable (e.g., enhanced, optimal, or maximal) mutual inductance with the SQUID component 320.

Figure 5:
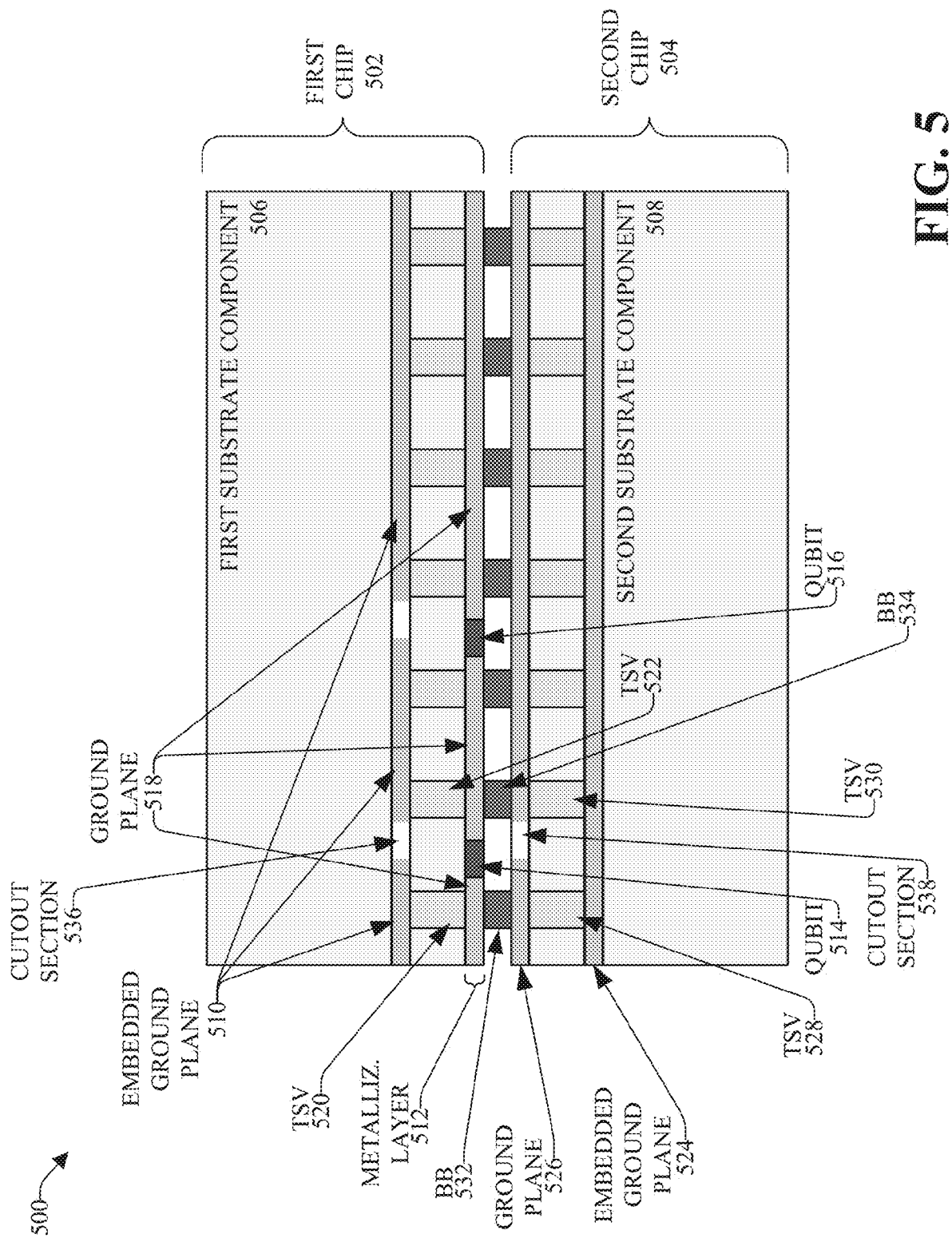
FIG. 5 illustrates a diagram of an example, non-limiting device that can comprise offset Josephson junction circuitry, an offset embedded ground plane cutout, and an interposer ground plane cutout that can enhance mutual inductance from a magnetic field generated by a coil component in connection with and to facilitate desirable tuning of a frequency of one or more flux tunable qubits of the device, in accordance with various aspects and embodiments of the disclosed subject matter.

Referring to FIG. 5, FIG. 5 illustrates a diagram of an example, non-limiting device 500 that can comprise offset Josephson junction circuitry, an offset embedded ground plane cutout, and an interposer ground plane cutout that can enhance mutual inductance from a magnetic field generated by a coil component in connection with and to facilitate desirable tuning of a frequency of one or more flux tunable qubits of the device 500, in accordance with various aspects and embodiments of the disclosed subject matter. The device 500 can comprise a system of various components and circuitry that can be arranged to perform one or more desired functions. In some embodiments, the device 500 can be or can comprise a qubit device (e.g., a frequency tunable qubit device). The device 500 can be substantially the same as (e.g., can be structured substantially the same as) the device 100, except as described and modified herein (e.g., to comprise an interposer ground plane cutout).

The device 500 can comprise a first chip 502 (e.g., qubit chip) and a second chip 504 (e.g., interposer chip) that can be arranged in relation to each other to form a multi-layer flip-chip package, wherein the second chip 504 can be flipped over (e.g., turned over) such that its top surface, with various components and circuitry formed thereon, can be facing, and in relatively close proximity to, the top surface of the first chip 502, on which various other components and circuitry can be formed. The device 500 can include a first substrate component 506 (also referred to herein as a first handler wafer) can be associated with the first chip 502, and a second substrate component 508 (also referred to as a second handler wafer) that can be associated with the second chip 504. The first chip 502 can comprise an embedded ground plane 510 that can be associated with (e.g., adjacent or attached to) and/or formed on the first substrate component 506. On the outer or top surface of the first chip 502, a metallization layer 512 (e.g., qubit metallization) can be formed or deposited, wherein the metallization layer 512 can comprise a conductive material, such as, for example, a desired superconductive material. The metallization layer 512 can be processed (e.g., chemically etched) to form a set of qubit components, comprising, for example, qubit component 514 and qubit component 516, and a ground plane 518 (e.g., qubit ground plane). A first set of TSVs, comprising TSV 520 and TSV 522, can be formed in the first chip 502. For example, the first set of TSVs (e.g., 520, 522) can be formed in structural material (e.g., qubit chip structural material) of the first chip 502, wherein the structural material can be situated between the embedded ground plane 510 and the ground plane 518 as well as qubits 514 and 516, wherein portions of the structural material that remain after the forming of the TSVs (e.g., 520, 522) can surround, and can define the shape and size of, the TSVs, and wherein the TSVs can have desired dimensions (e.g., width and/or height). In accordance with various embodiments, the structural material can be or can comprise a same or similar material as the substrate material of the first substrate component 506.

With further regard to the second chip 504, the second chip 504 can comprise an embedded ground plane 524 that can be associated with (e.g., adjacent or attached to) and/or formed on the second substrate component 508. On the outer or top surface of the second chip 504, a ground plane 526 (e.g., interposer ground plane) can be formed or deposited, wherein the ground plane 526 can comprise a conductive material, such as, for example, a desired superconductive material. A second set of TSVs, comprising TSV 528 and TSV 530, can be formed in the second chip 504. For instance, the second set of TSVs (e.g., 528, 530) can be formed in structural material interposer chip structural material of the second chip 504, wherein such structural material can be situated between the embedded ground plane 524 and the ground plane 526, wherein portions of such structural material that remain after the forming of the TSVs (e.g., 528, 530) can surround, and can define the shape and size of, the TSVs, and wherein the TSVs can have desired dimensions (e.g., width and/or height). In accordance with various embodiments, the structural material of the second chip 504 can be or can comprise a same or similar material as the substrate material of the second substrate component 508.

In some embodiments, a set of bump bond components, comprising, for example, bump bond component 532 and bump bond component 534, can be formed between the ground plane 518 of the first chip 502 and the ground plane 526 of the second chip 504, for example, in proximity to the locations of respective TSVs of the first set of TSVs (e.g., TSV 520, TSV 522, and/or other TSVs) and the second set of TSVs (e.g., TSV 528, TSV 530, and/or other TSVs). The set of bump bond components (e.g., 532, 534) can connect or facilitate connection of components on the first chip 502 to components on the second chip 504.

In certain embodiments, the disclosed subject matter can desirably (e.g., properly, suitably, or optimally) form and structure a cutout section (e.g., offset cutout section), such as cutout section 536, in the embedded ground plane 510 and other features of a device 500 to enable desirable tuning of qubit components (e.g., qubit component 514) of the device 500, while mitigating (e.g., reducing or minimizing) undesirable transmission of electromagnetic energy from qubits to the handler wafer and undesirable crosstalk between qubits. The disclosed subject matter also can offset Josephson junction circuitry (e.g., SQUID component (e.g., SQUID loop)) of the qubit components (e.g., 514), which along with the cutout section (e.g., 536) positioned over the offset Josephson junction circuitry, can enable desirable tuning of the qubit components (e.g., 514) of the device 500, while mitigating (e.g., reducing or minimizing) undesirable transmission of electromagnetic energy from qubits to the handler wafer and undesirable crosstalk between qubits, as more fully described herein.

In some embodiments, in addition to comprising the offset Josephson junction circuitry (e.g., offset SQUID loop) and the offset embedded ground plane cutout sections (e.g., cutout section 536) formed in the embedded ground plane 510 on the first chip 502 (e.g., qubit chip), also can comprise an interposer ground plane cutout section 538 that can be formed in the ground plane 526 (e.g., interposer ground plane) of the second chip 504 (e.g., interposer chip) in proximity to the offset Josephson junction circuitry (e.g., offset SQUID loop) of the qubit component 514. A coil component 540 can apply a desired magnetic flux to the offset SQUID component of the qubit component 514 via the cutout section 536 formed in the embedded ground plane 510, wherein the magnetic flux also is able to pass through (e.g., permeate) the first substrate component 506 and the structural material (e.g., qubit chip structural material) between TSV 520 and TSV 522. In certain embodiments, the interposer ground plane cutout section 538 can be offset by a defined distance relative to the center (e.g., qubit center) of the qubit component 514 and/or the associated offset SQUID component of the qubit component 514 in a same or similar manner as the cutout section 536 formed in the embedded ground plane 510 on the first chip 502. The additional cutout section (e.g., interposer ground plane cutout section 538) formed in the ground plane 526 can enhance (e.g., increase or improve) the amount of mutual inductance produced from the magnetic field generated by a coil component 540, which can further enhance, and make more efficient, the process of tuning a frequency of one or more flux tunable qubits of the device 500.

It is to be appreciated and understood that, while the device 500 only depicts two cutout sections, including cutout section 536 formed in the embedded ground plane 510, and one cutout section 538 formed in the ground plane 526, the disclosed subject matter is not so limited, and, in accordance with various embodiments, the device 500 can comprise a desired number of cutout sections formed in the embedded ground plane 510 and a desired number of cutout sections formed in the ground plane 526, for example, to correspond with and be respectively associated with respective qubit components formed on the device 500.

Figure 6:
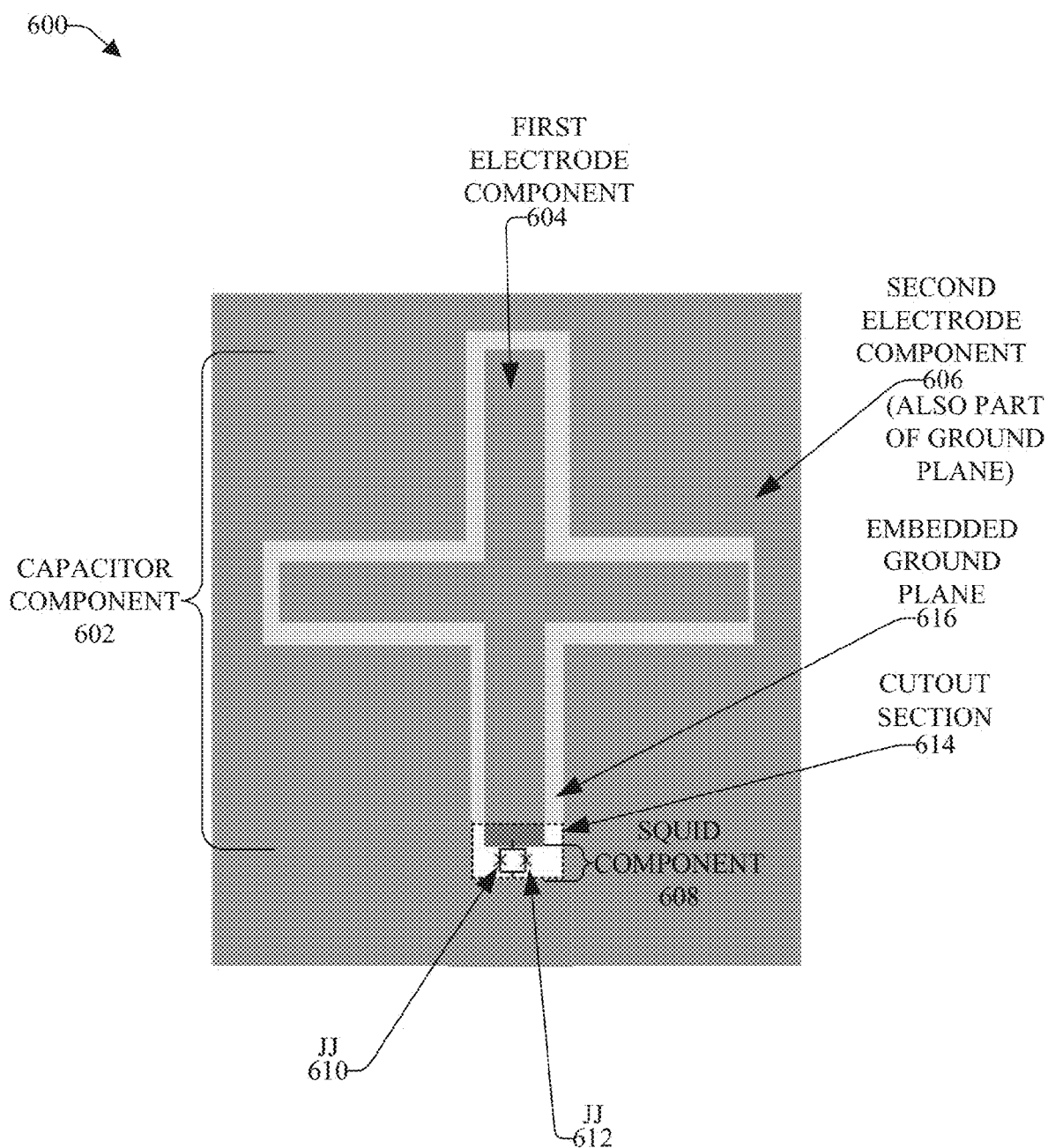
FIG. 6 illustrates a diagram of an example X-mon qubit component that can comprise offset Josephson junction circuitry and can be associated with an offset ground plane cutout section to facilitate desirable tuning of qubits of a qubit device, in accordance with various aspects and embodiments of the disclosed subject matter.

With further regard to qubits and associated capacitors, in addition to the qubit and associated capacitor designs described herein with regard to FIGS. 1-5, the disclosed subject matter can employ and implement offset Josephson junction circuitry and offset ground plane cutout sections with regard to various other types of qubits and associated capacitors in a similar manner as described herein with regard to FIGS. 1-5. In that regard, referring briefly to FIG. 6, FIG. 6 illustrates a diagram of an example X-mon qubit component 600 that can comprise offset Josephson junction circuitry and can be associated with an offset ground plane cutout section to facilitate desirable tuning of qubits of a qubit device, in accordance with various aspects and embodiments of the disclosed subject matter. The X-mon qubit component 600 can comprise a cross-shaped qubit capacitor component 602, which can comprise a first electrode component 604, which can be structured in a form resembling a cross, and a second electrode component 606.

The X-mon qubit component 600 can include Josephson junction circuitry that can be offset by a desired distance from the center point of the X-mon qubit component 600 towards and/or near an end of one of the electrode components (e.g., first electrode component 604). In some embodiments, the Josephson junction circuitry can comprise a SQUID component 608 (e.g., SQUID loop) (as depicted), which can include at least two Josephson junction components, including Josephson junction components 610 and 612. In other embodiments, other types of Josephson junction circuitry can be employed with the X-mon qubit component 600. In certain embodiments, one of the electrode components, such as the second electrode component 606, can be part of a ground plane (e.g., qubit ground plane) of the qubit device. The first electrode component 604, the second electrode component 606, and the Josephson junction circuitry (e.g., SQUID component 608) can be formed of a desired conductive material, such as a desired superconducting material.

A cutout section 614 can be formed in an embedded ground plane 616 of a qubit chip of the qubit device, in a same as or similar manner as more fully described herein. The cutout section 614 can be formed in the embedded ground plane such that it can be offset by a desired distance from center point of the qubit (e.g., a desired distance from the center or crossing (e.g., intersecting) point of the cross-shaped qubit capacitor component 602), and/or can be offset by a desired distance from the center point of the Josephson junction circuitry (e.g., SQUID component 608), wherein at least a portion of the cutout section 614 can be positioned over the Josephson junction circuitry.

Figure 7:
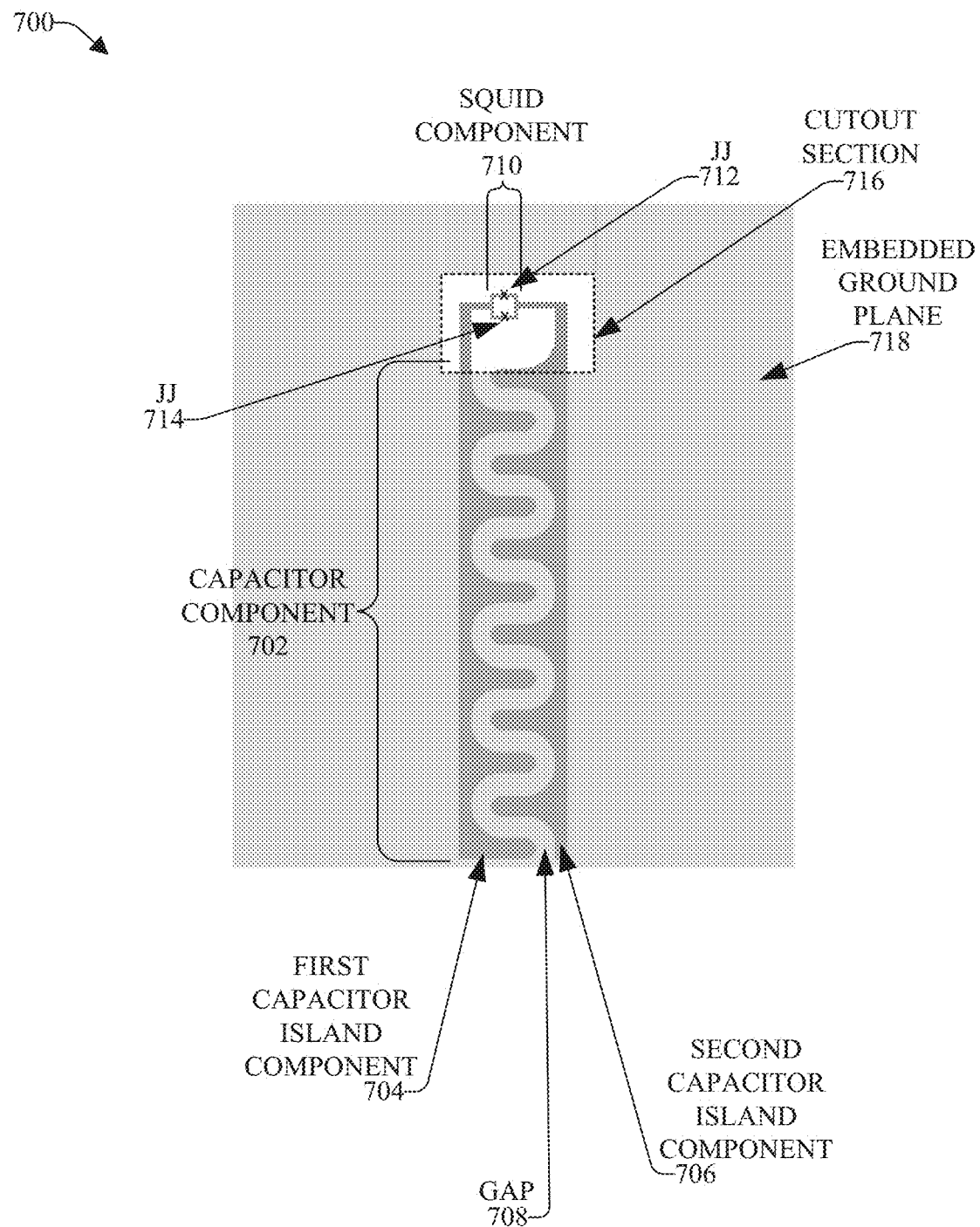
FIG. 7 depicts a diagram of an example transmon qubit component that can comprise offset Josephson junction circuitry and can be associated with an offset ground plane cutout section to facilitate desirable tuning of qubits of a qubit device, in accordance with various aspects and embodiments of the disclosed subject matter.

Turning briefly to FIG. 7, FIG. 7 depicts a diagram of an example transmon qubit component 700 that can comprise offset Josephson junction circuitry and can be associated with an offset ground plane cutout section to facilitate desirable tuning of qubits of a qubit device, in accordance with various aspects and embodiments of the disclosed subject matter. The transmon qubit component 700 can comprise a capacitor component 702 that can comprise a first capacitor island component 704 and a second capacitor island component 706 that can be separated from each other by a desired gap 708 (e.g., space). In some embodiments, the first capacitor island component 704 and the second capacitor island component 706 can be shaped and arranged in relation to each other such that the gap 708 can appear to resemble a snake.

The transmon qubit component 700 can comprise Josephson junction circuitry that can be offset by a desired distance from the center point of the transmon qubit component 700 towards and/or near an end of the capacitor component 702 (e.g., near the corresponding or associated ends of the first capacitor island component 704 and the second capacitor island component 706). In some embodiments, the Josephson junction circuitry can comprise a SQUID component 710 (e.g., SQUID loop) (as depicted), which can include at least two Josephson junction components, including Josephson junction components 712 and 714. In other embodiments, other types of Josephson junction circuitry can be employed with the transmon qubit component 700. The first capacitor island component 704, the second capacitor island component 706, and the Josephson junction circuitry (e.g., SQUID component 710) can be formed of a desired conductive material, such as a desired superconducting material.

A cutout section 716 can be formed in an embedded ground plane 718 of a qubit chip of the qubit device, in a same as or similar manner as more fully described herein. The cutout section 716 can be formed in the embedded ground plane 718 such that it can be offset by a desired distance from center point of the qubit (e.g., center point of the transmon qubit component 700), and/or can be offset by a desired distance from the center point of the Josephson junction circuitry (e.g., SQUID component 710), wherein at least a portion of the cutout section 716 can be positioned over the Josephson junction circuitry.

The disclosed subject matter, by desirably offsetting Josephson junction circuitry, creating a cutout section(s) in the embedded ground plane of the qubit chip, offsetting the cutout section(s) in the embedded ground plane of the qubit chip, creating a cutout section(s) in the interposer ground plane of the interposer chip, and/or offsetting the cutout section(s) in the interposer ground plane of the interposer chip, can enable desirable mitigation or reduction in frequency collisions in multi-qubit devices by enabling tuning of qubit frequencies after fabrication of the multi-layer qubit devices using either magnetic field and/or laser tuning. The disclosed subject matter also can reduce challenges that can be faced during fabrication of multi-qubit devices with regard to achieving precise target qubit frequencies in multi-qubit devices. The disclosed subject matter also can add to the knowledge-base of device structures for mitigating cross talk and chip mode coupling. The disclosed subject matter also can facilitate (e.g., enable) yielding larger multi-qubit devices significantly more quickly.

Figure 8:
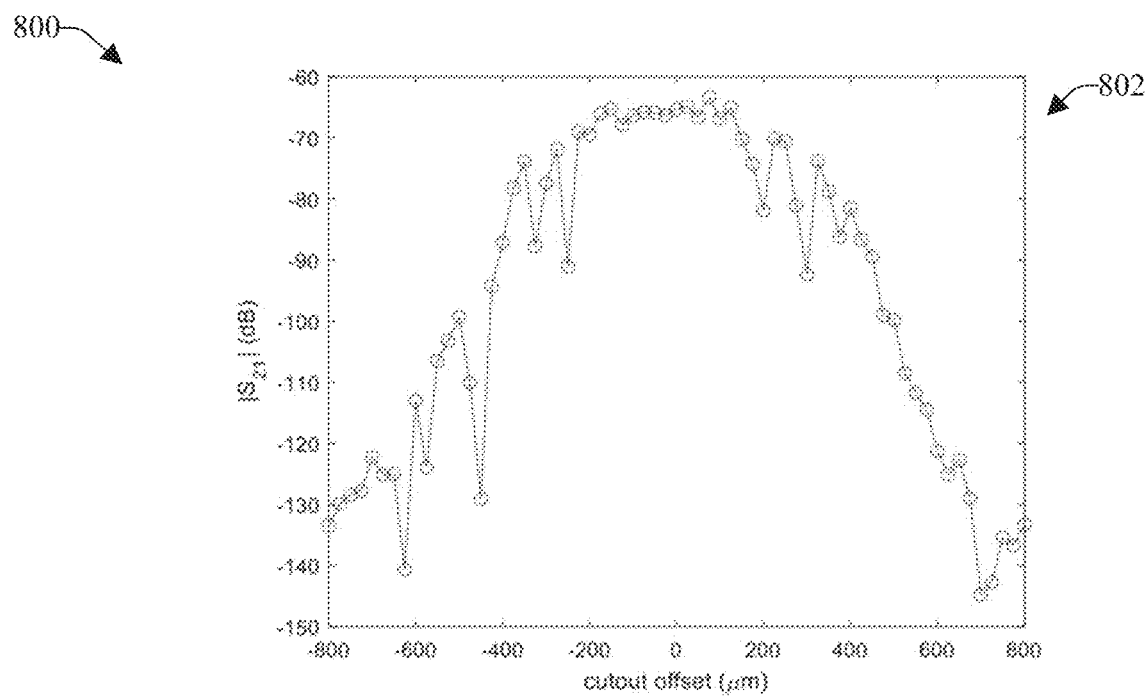
FIG. 8 presents a diagram of example graphs of handler coupling dependence in relation to ground plane cutout offset, in accordance with various aspects and embodiments of the disclosed subject matter.
Figure 8:
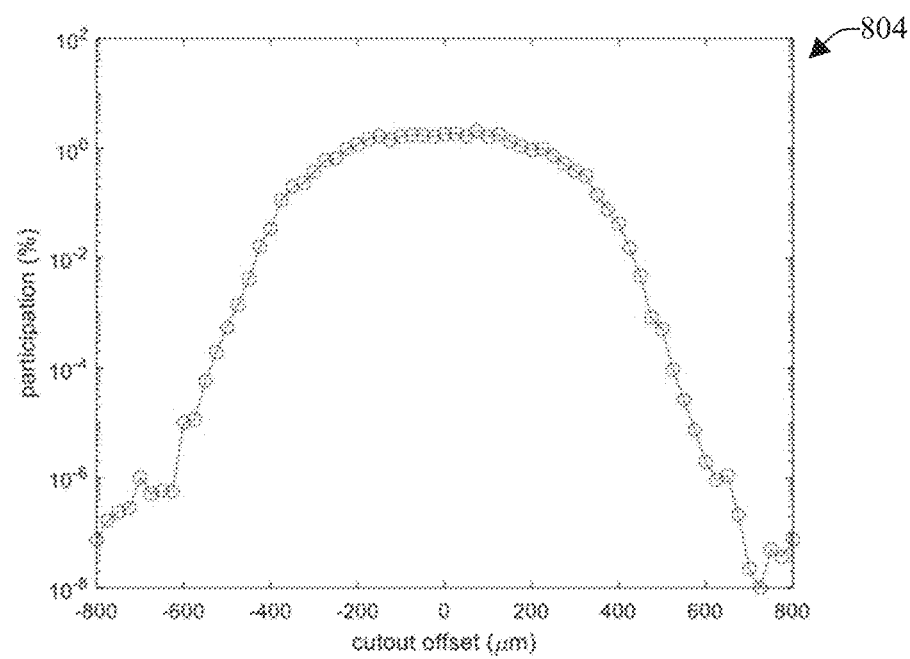

Referring briefly to FIG. 8, FIG. 8 presents a diagram of example graphs 800 of handler coupling dependence in relation to ground plane cutout offset, in accordance with various aspects and embodiments of the disclosed subject matter. The example graphs 800 comprise graph 802, which can present the transmission $S_{21}$ (e.g., qubit to handler wafer), in decibels (dB), measured at 2.5 gigahertz (GHz) (e.g., at a lowest frequency chip mode of the qubit device) as a function of the ground plane cutout offset in μm. The example graphs 800 also can include graph 804, which can present the percentage of participation of a qubit electric field in the handler wafer as a function of the ground plane cutout offset in μm. In the graphs 802 and 804, a 0 cutout offset can correspond to the original case where the ground plane cutout section, coil, and qubit ground plane pocket are all concentric. As can be observed in the graphs 802 and 804, offsetting a 600 μm×600 μm ground plane cutout section can desirably reduce the amount of coupling between the qubit and handler wafer, and can desirably reduce the percentage of participation of the qubit electric field in the handler wafer.

Figure 9:
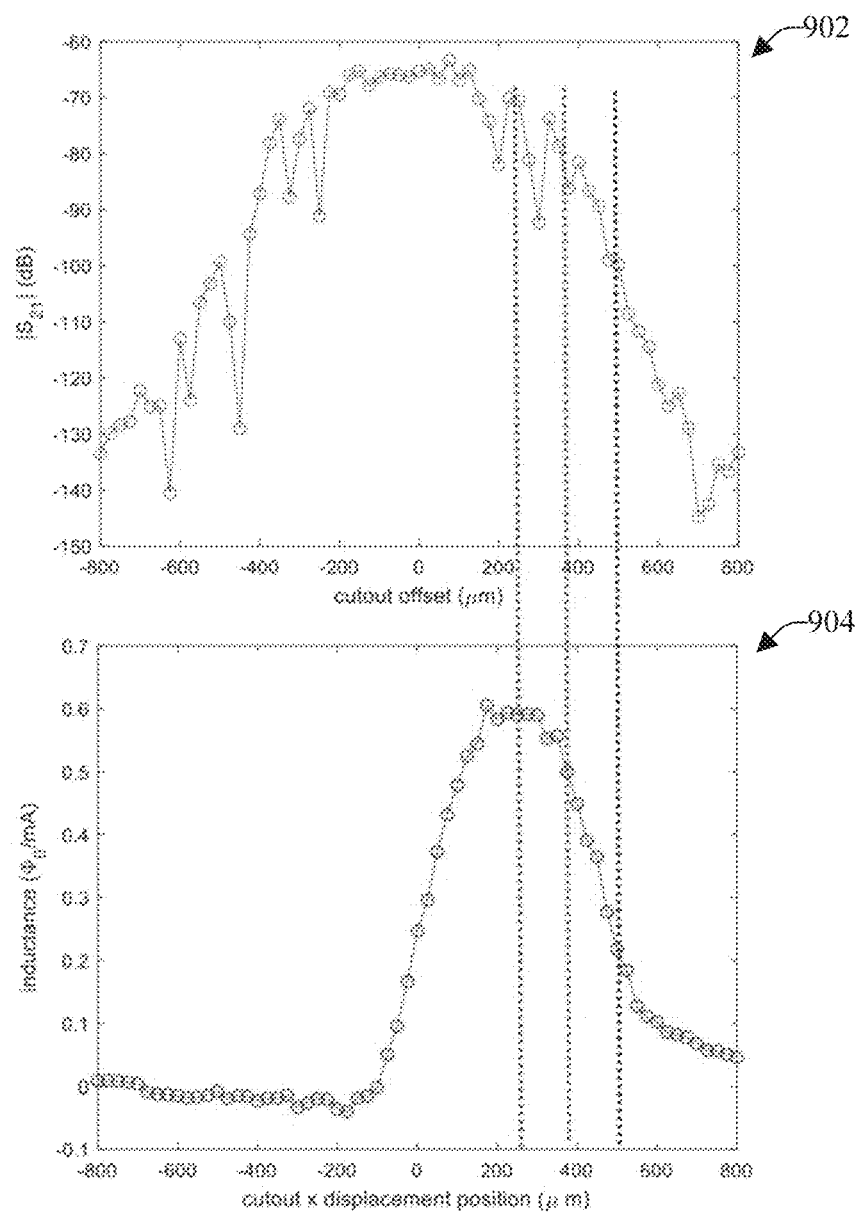
FIG. 9 depicts a diagram of example graphs that can illustrate magnetic field and qubit-handler transmission dependence, in accordance with various aspects and embodiments of the disclosed subject matter.

FIG. 9 depicts a diagram of example graphs 900 that can illustrate magnetic field and qubit-handler transmission dependence, in accordance with various aspects and embodiments of the disclosed subject matter. The example graphs 900 can comprise graph 902, which can present the transmission $S_{21}$ (e.g., qubit to handler wafer), in decibels (dB), measured at 2.5 GHz (e.g., at a lowest frequency chip mode of the qubit device) as a function of the ground plane cutout offset in μm. The example graphs 900 also can include graph 904, which can present an amount of mutual inductance ($\Phi_0$/milliamps (mA)) as a function of ground plane cutout x displacement position (μm). With regard to the data presented in the graphs 902 and 904, such data is based on the coil being concentric with the center of the ground plane cutout.

As can be observed in the graphs 902 and 904, the maximum mutual inductance can occur when the coil, cutout section, and the SQUID are all centered with the offset of the ground plane cutout section being approximately 250 μm. As also can be observed in the graphs 902 and 904, approximately 34 dB attenuation (e.g., 50× change in amplitude of $S_{21}$) can be obtained with sufficient flux coupling (e.g., 0.22 $\Phi_0$/mA) for a 500 μm offset of the ground plane cutout section. As further can be observed in the graphs 902 and 904, even with the qubit device mostly covered by the embedded ground plane (e.g., 600 μm ground plane cutout section), approximately 56 dB attenuation (630×change in $S_{21}$) can be obtained, and there can still be approximately 0.1 $\Phi_0$/mA of mutual inductance.

Figure 10:
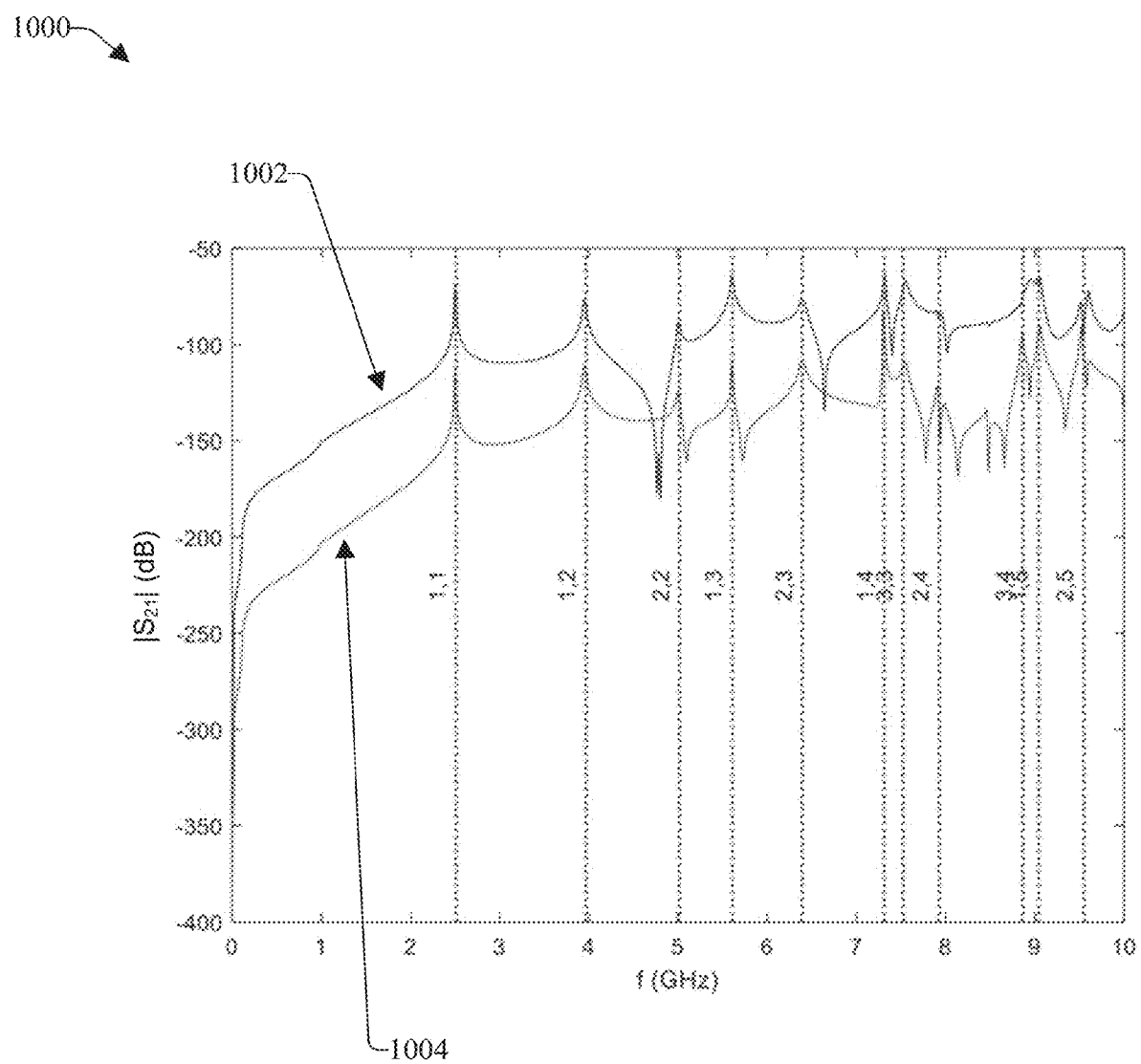
FIG. 10 depicts a diagram of an example graph of frequency dependence of handler coupling with a ground plane cutout offset, in accordance with various aspects and embodiments of the disclosed subject matter.

Referring briefly to FIG. 10, FIG. 10 depicts a diagram of an example graph 1000 of frequency dependence of handler coupling with a ground plane cutout offset, in accordance with various aspects and embodiments of the disclosed subject matter. The graph 1000 illustrates transmission $S_{21}$ (e.g., qubit to handler wafer), in dB, as a function of frequency (f) in GHz with no offset of a ground plane cutout section (as indicated by reference numeral 1002) and with a 500 μm offset of the ground plane cutout section (as indicated by reference numeral 1004). As can be observed from the graph 1000, including the respective data points (e.g., respective graph lines) indicated at reference numerals 1002 and 1004, suppressed coupling to the handler wafer of the qubit device can be desirably broadband with offset of the ground plane cutout section, including at handler mode frequencies.

Figure 11:
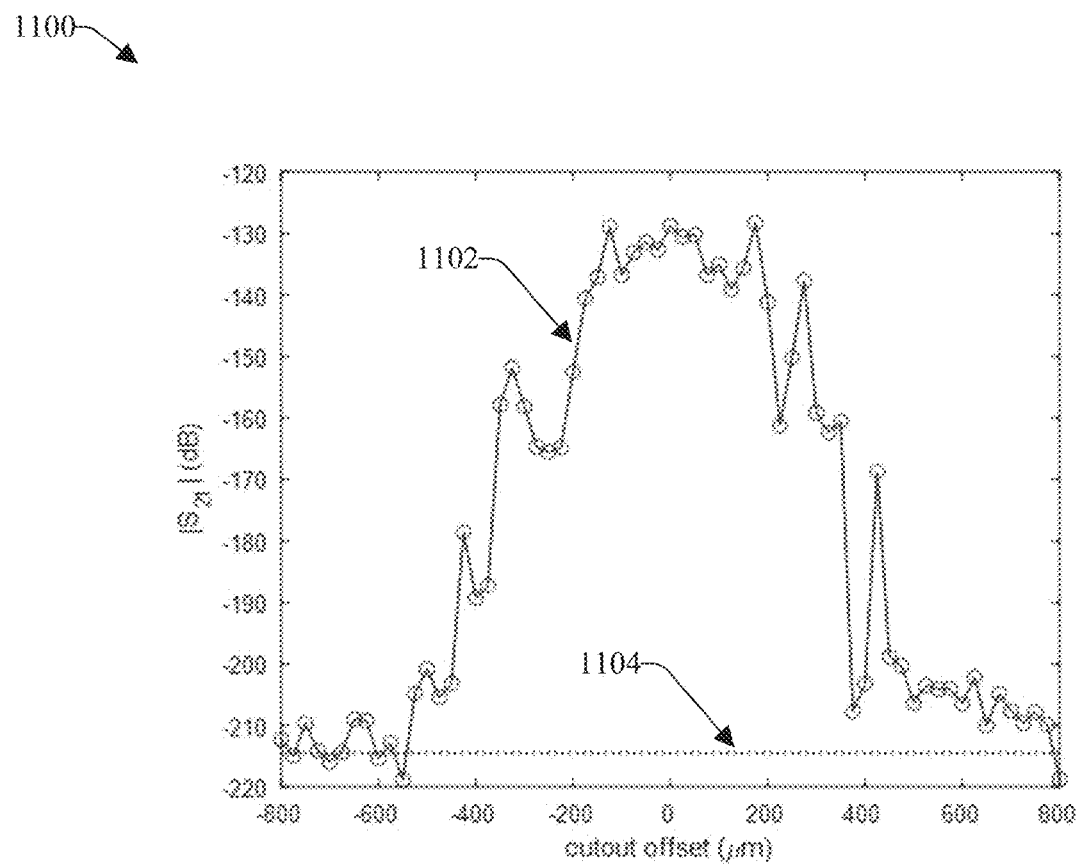
FIG. 11 illustrates a diagram of an example graph of qubit crosstalk versus ground plane cutout offset, in accordance with various aspects and embodiments of the disclosed subject matter.
Figure 12:
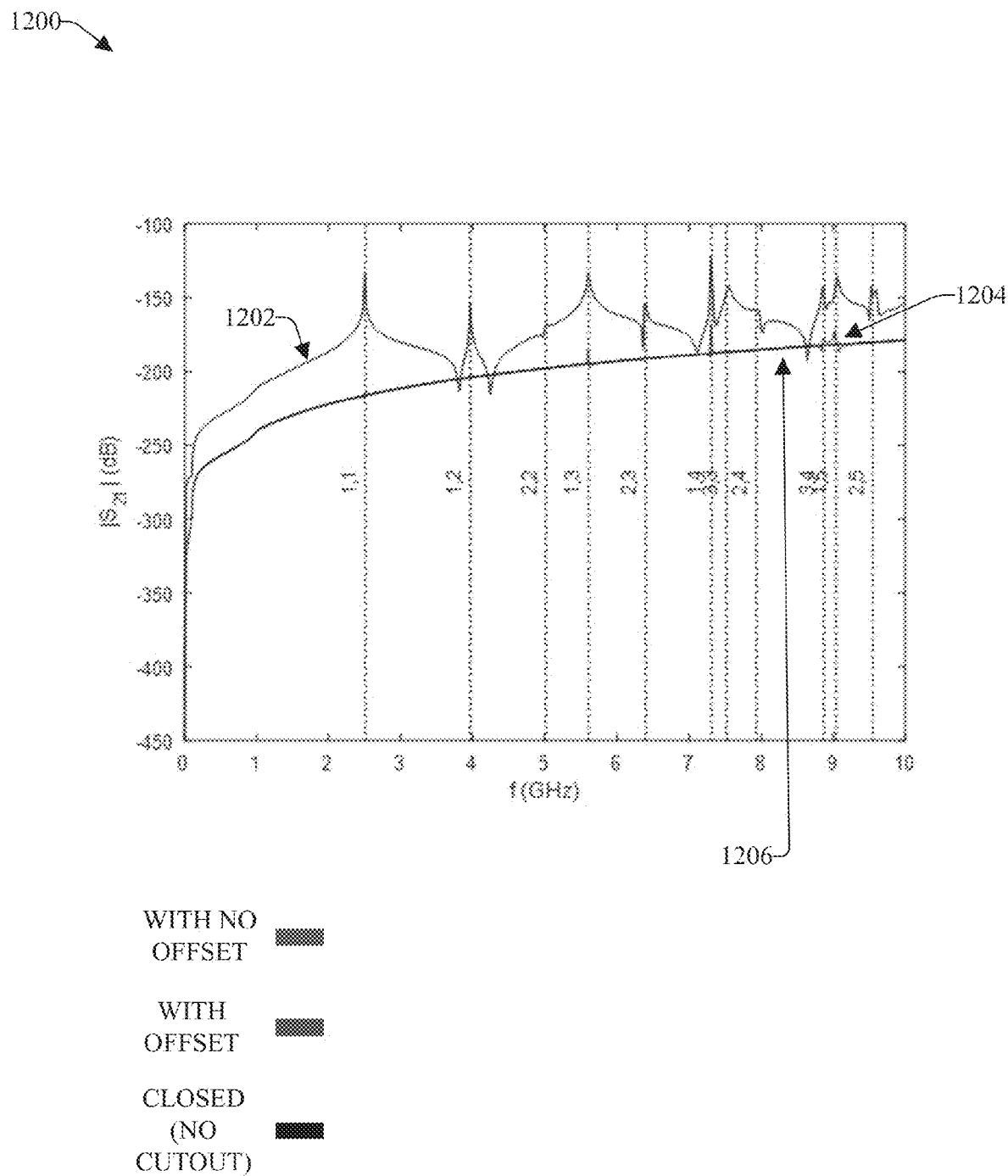
FIG. 12 illustrates a diagram of an example graph transmission $S_{21}$ (e.g., qubit to qubit crosstalk) as a function of frequency, in accordance with various aspects and embodiments of the disclosed subject matter.

Turning briefly to FIGS. 11 and 12, FIG. 11 illustrates a diagram of an example graph 1100 of qubit crosstalk versus ground plane cutout offset, and FIG. 12 illustrates a diagram of an example graph 1200 transmission $S_{21}$ (e.g., qubit to qubit crosstalk via handler wafer mode), in dB, as a function of frequency (f) in GHz, in accordance with various aspects and embodiments of the disclosed subject matter. The graph 1100 can present transmission $S_{21}$ (e.g., qubit to qubit crosstalk via handler wafer mode), in dB, as a function of cutout offset, in μm, of a ground plane cutout section in an embedded ground plane of the qubit device with regard to crosstalk at a handler mode frequency of 2.5 GHz, and with a qubit-to-qubit distance of 2 millimeters (as indicated by the data points at reference numeral 1102). The transmission $S_{21}$ when there a closed (e.g., no cutout section in) embedded ground plane in the qubit device is indicated at reference numeral 1104.

The graph 1200 can present transmission $S_{21}$ as a function of frequency with no offset of a ground plane cutout section in an embedded ground plane of the qubit device (as indicated by the data points at reference numeral 1202), with an offset of a ground plane cutout section (as indicated by the data points at reference numeral 1204), and with a closed (e.g., no cutout section in) embedded ground plane (as indicated by the data points at reference numeral 1206). As can be observed in the graph 1100 and the graph 1200, crosstalk between qubits (e.g., adjacent qubits) can be desirably suppressed with offsets (e.g., for 'cutouts offset'>500 μm) of a ground plane cutout section in the embedded ground plane of the qubit device, and the amount of crosstalk between qubits with a cutout offset in the embedded ground plane can be at a substantially same level as the amount of crosstalk between qubits when there is no cutout in the embedded ground plane of the qubit device (e.g., when the qubits can be closed off from the handler wafer of the qubit device). Accordingly, the graph line at reference numeral 1204 (e.g., for a cutout offset) substantially overlaps the graph line at reference numeral 1206 (for a closed embedded ground plane).

Figure 13:
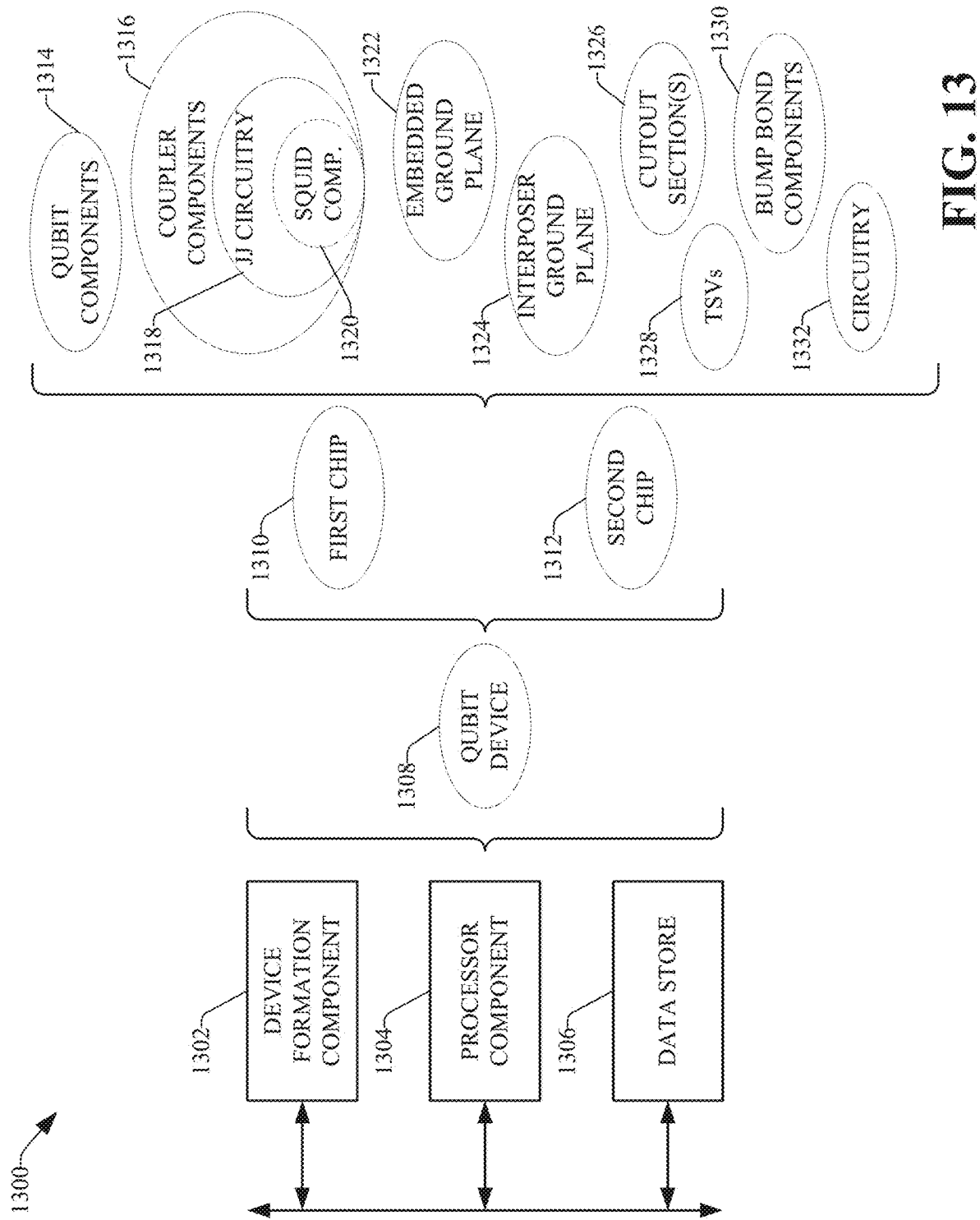
FIG. 13 depicts a block diagram of an example system that can be utilized to create, form, or design a qubit device comprising offset Josephson junction circuitry, offset embedded ground plane cutout section, and/or offset interposer ground plane cutout section, in accordance with various aspects and embodiments of the disclosed subject matter.

FIG. 13 depicts a block diagram of an example system 1300 that can be utilized to create, form, or design a qubit device comprising offset Josephson junction circuitry, offset embedded ground plane cutout section, and/or offset interposer ground plane cutout section, in accordance with various aspects and embodiments of the disclosed subject matter. The system 1300 can comprise a device formation component 1302, a processor component 1304, and a data store 1306. The device formation component 1302 can be utilized to create, form, or design various components of or associated with a qubit device 1308, and can tune (e.g., via laser tuning or flux tuning) a frequency of qubit components of the qubit device 1308, such as more fully described herein. For instance, the device formation component 1302 can be utilized to create, form, or design the various components that can be formed or situated on a first chip 1310 (e.g., qubit chip) and various components that can be formed or situated on a second chip 1312 (e.g., interposer chip). The various components can comprise, for example, qubit components 1314, coupler components 1316 (which can comprise or be associated with capacitor components), Josephson junction (JJ) circuitry 1318 (e.g., offset Josephson junction circuitry), which, in some embodiments, can include SQUID components (SQUID COMP.) 1320 (e.g., SQUID loops), embedded ground plane 1322, interposer ground plane 1324, cutout section(s) 1326 (e.g., offset cutout section(s) in the embedded ground plane and/or interposer ground plane), TSVs 1328, bump bond components 1330, and associated circuitry 1332. The device formation component 1302 also can employ and/or control the operation of a laser device or a coil component to tune a frequency of qubit components 1314 of the qubit device 1308 (e.g., post fabrication of the qubit device 1308).

As part of and to facilitate creating, forming, or designing the various components of or associated with a qubit device 1308, the device formation component 1302 can form or process substrate components, such as a first substrate component that can be part of the first chip 1310 and a second substrate component that can be part of the second chip 1312. Also, as part of and to facilitate creating, forming, or designing the various components of or associated with a qubit device 1308, the device formation component 1302 also can form, deposit, or process one or more metallization layers on the first and second substrate components, wherein the metallization layers can be formed of one or more desired metal or conductive materials, which can be or include one or more desired superconductive materials (e.g., a niobium-type superconducting material), and wherein a metallization layer can have a desired thickness or height. In some embodiments, the device formation component 1302 can remove (e.g., selectively remove) respective portions of a metallization layer to facilitate creating or forming respective components or circuitry of the qubit device 1308. For example, the device formation component 1302 can employ and/or can control various processes, including microfabrication processes, nanofabrication processes, masking or photoresist processes, photolithography processes, chemical etching processes, other etching or removal processes, or other desired processes to desirably process the metallization layer and remove the respective portions of the metallization layer to facilitate creating or forming the respective components or circuitry of the qubit device 1308.

The processor component 1304 can work in conjunction with the other components (e.g., the device formation component 1302, the data store 1306, or another component) to facilitate performing the various functions of the system 1300. The processor component 1304 can employ one or more processors, microprocessors, or controllers that can process data, such as information relating to qubit devices, qubit components, coupler components, SQUID loops, Josephson junction components, capacitor components, inductor components, embedded ground planes, interposer ground planes, cutout sections in embedded ground planes and/or interposer ground planes, TSVs, bump bond components, circuit design criteria, circuit design algorithms, traffic flows, policies, protocols, interfaces, tools, and/or other information, to facilitate operation of the system 1300, as more fully disclosed herein, and control data flow between the system 1300 and other components (e.g., computer components, computer, laptop computer, other computing or communication device, or network device) associated with (e.g., connected to) the system 1300.

The data store 1306 can store data structures (e.g., user data, metadata), code structure(s) (e.g., modules, objects, hashes, classes, procedures) or instructions, information relating to qubit devices, qubit components, coupler components, SQUID loops, Josephson junction components, capacitor components, inductor components, embedded ground planes, interposer ground planes, cutout sections in embedded ground planes and/or interposer ground planes, TSVs, bump bond components, circuit design criteria, circuit design algorithms, traffic flows, policies, protocols, interfaces, tools, and/or other information, to facilitate controlling operations associated with the system 1300. In an aspect, the processor component 1304 can be functionally coupled (e.g., through a memory bus) to the data store 1306 in order to store and retrieve information desired to operate and/or confer functionality, at least in part, to the device formation component 1302, the data store 1306, or other component, and/or substantially any other operational aspects of the system 1300.

It should be appreciated that the data store 1306 described herein can comprise volatile memory and/or nonvolatile memory. By way of example and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which can act as external cache memory. By way of example and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 14:
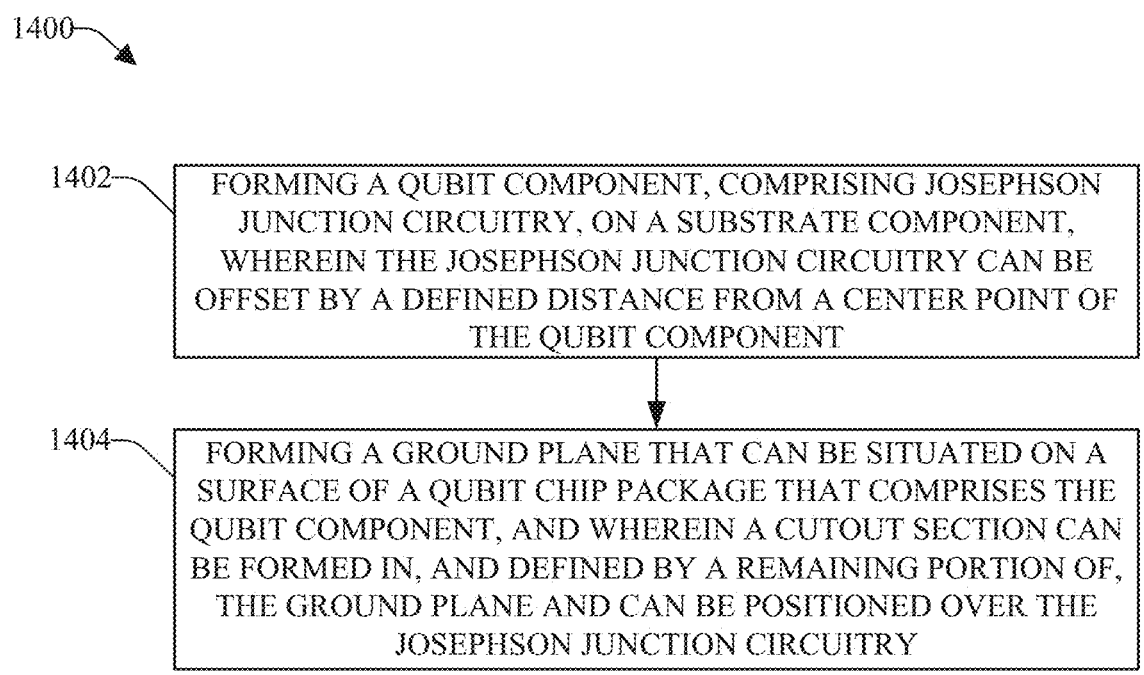
FIG. 14 illustrates a flow diagram of an example, non-limiting method that can form offset circuitry and a ground plane cutout to facilitate tuning of a frequency of one or more qubits of a qubit device, in accordance with various aspects and embodiments of the disclosed subject matter.

FIG. 14 illustrates a flow diagram of an example, non-limiting method 1400 that can form offset circuitry and a ground plane cutout to facilitate tuning of a frequency of one or more qubits of a qubit device, in accordance with various aspects and embodiments of the disclosed subject matter. The method 1400 can be performed by, for example, a system (e.g., computer system) comprising or operatively coupled to a device formation component, a processor component, and a memory. Repetitive description of like elements employed in other embodiments described herein is or may be omitted for sake of brevity.

At 1402, a qubit component, comprising Josephson junction circuitry, can be formed on a substrate component, wherein the Josephson junction circuitry can be offset by a defined distance from a center point of the qubit component. The device formation component can form the qubit component, comprising the Josephson junction circuitry, on the substrate component (e.g., substrate component on the qubit chip), wherein the Josephson junction circuitry can be offset by a defined distance from a center point of the qubit component.

At 1404, a ground plane can be formed, wherein the ground plane can be situated on a surface of a qubit chip package that comprises the qubit component, and wherein a cutout section can be formed in, and defined by a remaining portion of, the ground plane and can be positioned over the Josephson junction circuitry. The device formation component can form the ground plane (e.g., embedded ground plane on the qubit chip), wherein the ground plane can be situated on a surface of a qubit chip package that can comprise the qubit component, and wherein a cutout section (e.g., offset cutout section) can be formed in, and defined by a remaining portion of, the ground plane and can be positioned over the Josephson junction circuitry.

Figure 15:
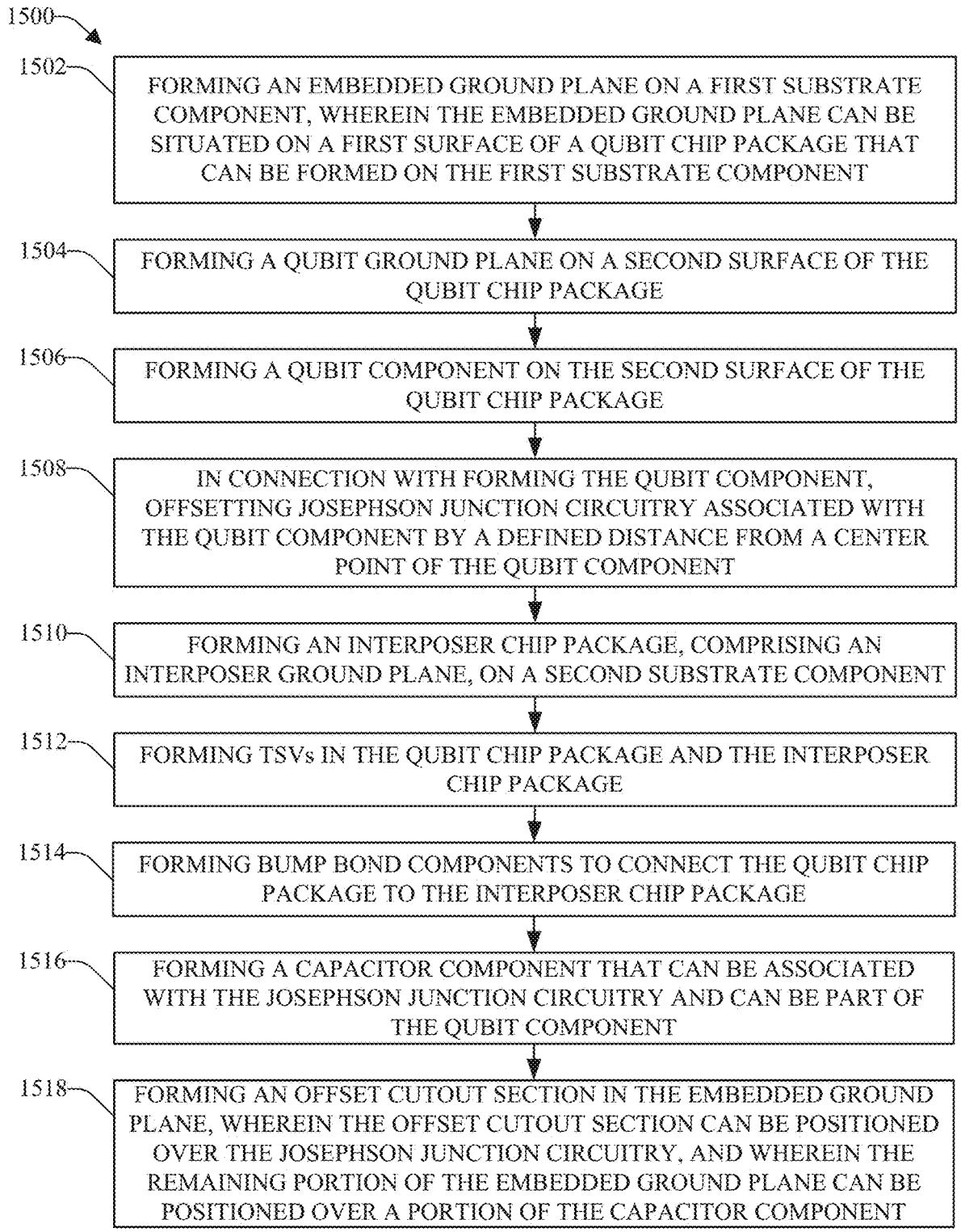
FIG. 15 depicts a flow diagram of another example, non-limiting method that can form offset circuitry and a ground plane cutout to facilitate tuning of a frequency of one or more qubits of a qubit device, in accordance with various aspects and embodiments of the disclosed subject matter.

FIG. 15 depicts a flow diagram of another example, non-limiting method 1500 that can form offset circuitry and a ground plane cutout to facilitate tuning of a frequency of one or more qubits of a qubit device, in accordance with various aspects and embodiments of the disclosed subject matter. The method 1500 can be performed by, for example, a system (e.g., computer system) comprising or operatively coupled to a device formation component, a processor component, and a memory. Repetitive description of like elements employed in other embodiments described herein is or may be omitted for sake of brevity.

At 1502, an embedded ground plane can be formed on a first substrate component, wherein the embedded ground plane can be situated on a first surface of a qubit chip package that can be formed on the first substrate component. The device formation component can form the embedded ground plane on a first substrate component (e.g., first substrate or handler wafer of a qubit chip), wherein the embedded ground plane can be situated on a first surface of a qubit chip package that can be formed on the first substrate component.

At 1504, a qubit ground plane can be formed on a second surface of the qubit chip package. The device formation component can form the qubit ground plane on a second surface (e.g., metallization layer) of the qubit chip package.

At 1506, a qubit component can be formed on the second surface of the qubit chip package. The device formation component can form the qubit component on the second surface (e.g., metallization layer) of the qubit chip package.

At 1508, in connection with forming the qubit component, Josephson junction circuitry associated with the qubit component can be offset by a defined distance from a center point of the qubit component. In connection with forming the qubit component, the device formation component can offset Josephson junction circuitry associated with the qubit component by a defined distance from a center point of the qubit component. In some embodiments, the Josephson junction circuitry can comprise a SQUID loop, which can include two or more Josephson junction components.

At 1510, an interposer chip package, comprising an interposer ground plane, can be formed on a second substrate component. The device formation component can form the interposer chip package, comprising the interposer ground plane, on the second substrate component (e.g., second substrate or handler wafer of the interposer chip).

At 1512, TSVs can be formed in the qubit chip package and the interposer chip package. The device formation component can form TSVs at desired locations in the qubit chip package (e.g., qubit chip assembly) and the interposer chip package (e.g., interposer chip assembly), as more fully described herein.

At 1514, bump bond components can be formed to connect the qubit chip package to the interposer chip package. The device formation component can form bump bond components to connect the qubit chip package to the interposer chip package (e.g., connect components of the qubit chip package to components of the interposer chip package).

At 1516, a capacitor component can be formed, wherein the capacitor component can be associated with the Josephson junction circuitry and can be part of the qubit component. The device formation component can form the capacitor component, wherein the capacitor component can be associated with the Josephson junction circuitry (e.g., offset Josephson junction circuitry) and can be part of the qubit component.

At 1518, an offset cutout section can be formed in the embedded ground plane, wherein the offset cutout section can be defined by a remaining portion of the embedded ground plane and can be positioned over the Josephson junction circuitry, and wherein the remaining portion of the embedded ground plane can be positioned over a portion of the capacitor component. The device formation component can form the offset cutout section in the embedded ground plane, wherein the offset cutout section can be defined by a remaining portion of the embedded ground plane and can be positioned over the Josephson junction circuitry, and wherein the remaining portion of the embedded ground plane can be positioned over a portion (e.g., most) of the capacitor component. In some embodiments, the device formation component can form the offset cutout section in the embedded ground plane such that the cutout section can be offset by a desired distance(s) in relation to the center point of the qubit component and/or in relation to a center point of the Josephson junction circuitry, as more fully described herein.

Figure 16:
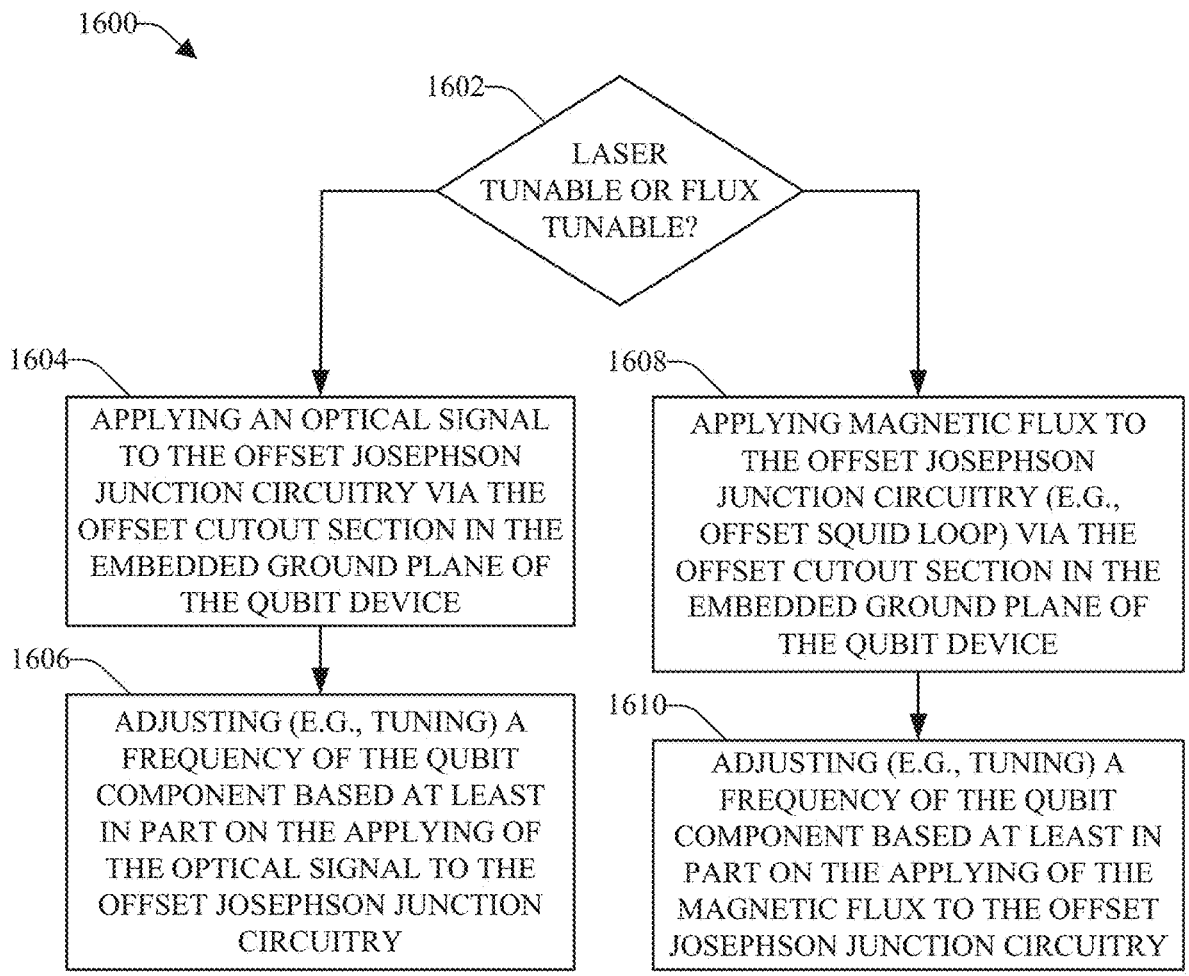
FIG. 16 illustrates a flow diagram of an example, non-limiting method that can tune a frequency of a qubit component of a qubit device, wherein the qubit device comprises an offset cutout section in an embedded ground plane and/or the qubit component comprises offset Josephson junction circuitry, in accordance with various aspects and embodiments of the disclosed subject matter.

FIG. 16 illustrates a flow diagram of an example, non-limiting method 1600 that can tune a frequency of a qubit component of a qubit device, wherein the qubit device comprises an offset cutout section in an embedded ground plane and/or the qubit component comprises offset Josephson junction circuitry, in accordance with various aspects and embodiments of the disclosed subject matter. The method 1600 can be performed by, for example, a system (e.g., computer system) comprising or operatively coupled to a device formation component, a processor component, and a memory. Repetitive description of like elements employed in other embodiments described herein is or may be omitted for sake of brevity.

At 1602, a determination can be made regarding whether a qubit component of a qubit device is laser tunable or flux tunable, wherein the qubit device comprises an offset cutout section in an embedded ground plane and/or the qubit component comprises offset Josephson junction circuitry. At 1604, if the qubit component is determined to be laser tunable, an optical signal can be applied to the offset Josephson junction circuitry via the offset cutout section in the embedded ground plane of the qubit device. At 1606, a frequency of the qubit component can be adjusted (e.g., tuned) based at least in part on the applying of the optical signal to the offset Josephson junction circuitry. If the qubit component is determined to be laser tunable, the device formation component can employ a laser device to generate the optical signal (e.g., a laser or light signal comprising a laser or light pulse) of a desired wavelength and apply the optical signal to the offset Josephson junction circuitry via the offset cutout section in the embedded ground plane of the qubit device. The device formation component, employing or controlling the laser device, can adjust or tune the frequency of the qubit component based at least in part on the applying of the optical signal to the offset Josephson junction circuitry.

Referring again to reference numeral 1602, if, at 1602, it is determined that the qubit component is flux tunable, at 1608, magnetic flux can be applied to the offset Josephson junction circuitry (e.g., offset SQUID loop) via the offset cutout section in the embedded ground plane of the qubit device. At 1610, a frequency of the qubit component can be adjusted (e.g., tuned) based at least in part on the applying of the magnetic flux to the offset Josephson junction circuitry. If the qubit component is determined to be flux tunable, the device formation component can employ a coil component (e.g., flux coil) to generate a desired magnetic flux and can apply the magnetic flux to the offset Josephson junction circuitry (e.g., offset SQUID loop) via the offset cutout section in the embedded ground plane of the qubit device. The device formation component, employing or controlling the coil component, can adjust or tune the frequency of the qubit component based at least in part on the applying of the magnetic flux to the offset Josephson junction circuitry. It is to be appreciated and understood that, in some embodiments, laser tuning and flux tuning can be performed on Josephson junction circuitry (e.g., laser tuning and flux tuning can be performed on Josephson junction components of a SQUID loop), if and as desired.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 17:
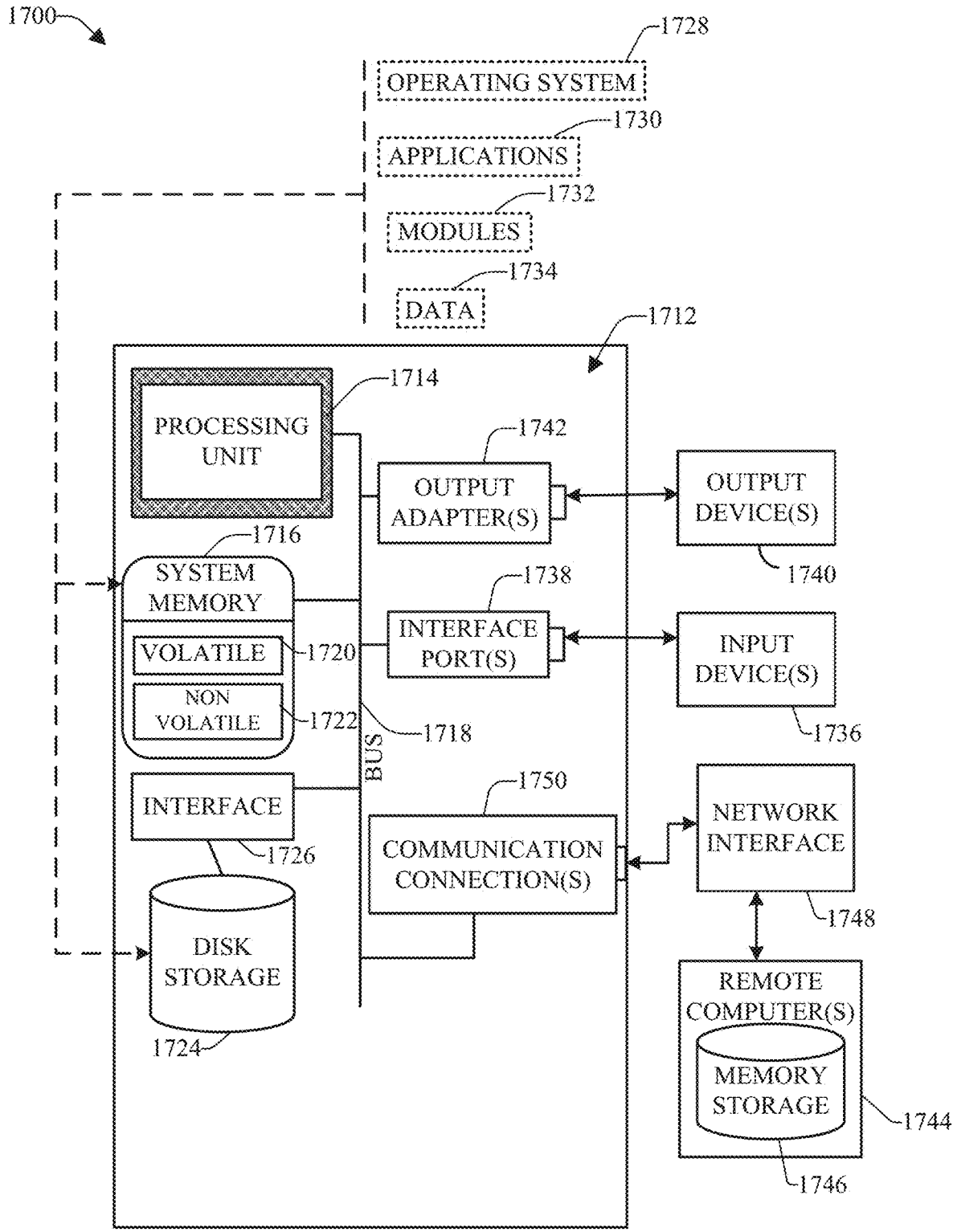
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is or may be omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM).

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a method of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a RAM, a ROM, an erasable programmable read-only memory (EPROM or Flash memory), a SRAM, a portable CD-ROM, a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM). Volatile memory can include RAM, which can act as external cache memory, for example. By way of illustration and not limitation, RAM is available in many forms such as SRAM, DRAM, SDRAM, DDR SDRAM, ESDRAM, SLDRAM, DRRAM, DRDRAM, and RDRAM. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a qubit chip assembly, comprising:
        a qubit component fabricated on a substrate, wherein the qubit component comprises a Josephson junction circuit that is offset by a defined distance from a center point of the qubit component; and
        a ground plane situated on a surface of the qubit chip assembly, wherein a cutout section is formed in, and defined by a remaining portion of, the ground plane and is positioned over the Josephson junction circuit.

2. The system of claim 1, wherein the cutout section of the ground plane is at least partially positioned over the Josephson junction circuit and is offset from the center point of the qubit component.

3. The system of claim 1, wherein the cutout section of the ground plane enables optical access of an optical signal to the Josephson junction circuit, and wherein a frequency of the qubit component is tuned based on application of the optical signal to the Josephson junction circuit.

4. The system of claim 1, wherein the Josephson junction circuit comprises a superconducting quantum interference device loop, wherein the cutout section of the ground plane enables access of a magnetic flux to the superconducting quantum interference device loop, and wherein a frequency of the qubit component is tuned based on application of the magnetic flux to the superconducting quantum interference device loop.

5. The system of claim 4, further comprising:
    a coil component that is concentric with the cutout section of the ground plane, wherein the coil component generates the magnetic flux and applies the magnetic flux to the superconducting quantum interference device loop.

6. The system of claim 5, wherein the cutout section of the ground plane is a first cutout section of the first ground plane, wherein a second ground plane is part of an interposer chip assembly that is associated with the qubit chip assembly, wherein a second cutout section is formed in the second ground plane and is positioned in proximity to the Josephson junction circuit, and wherein the second cutout section facilitates an increase in an amount of mutual inductance resulting from a magnetic field generated by the coil component.

7. The system of claim 1, wherein the qubit component is associated with a first ground plane situated on a first surface of the qubit chip assembly, wherein the ground plane situated on the surface of the qubit chip assembly is a second ground plane situated on a second surface of the qubit chip assembly, wherein the second ground plane is embedded in the substrate, and wherein the second ground plane is on an opposite side of the qubit chip assembly from the first ground plane.

8. The system of claim 7, further comprising:
a capacitor component that is associated with the Josephson junction circuit and part of the qubit component, wherein the remaining portion of the second ground plane is positioned over at least a portion of the capacitor component.

9. The system of claim 7, wherein the substrate is a first substrate that provides physical support to the qubit chip assembly, wherein the qubit chip assembly comprises a first set of through-vias, and wherein the system further comprises:
an interposer component that comprises a second set of through-vias, wherein the interposer component is electrically connected to the qubit chip assembly via a set of bump bonds; and
a second substrate that provides physical support to the interposer component.

10. A method, comprising:
forming a qubit component, comprising Josephson junction circuitry, on a substrate, wherein the Josephson junction circuitry is offset by a defined distance from a center point of the qubit component; and
forming a ground plane situated on a surface of a qubit chip package that comprises the qubit component, wherein a cutout section is formed in, and defined by a remaining portion of, the ground plane and is positioned over the Josephson junction circuitry.

11. The method of claim 10, wherein the cutout section of the ground plane enables access of an optical signal to the Josephson junction circuitry, wherein a frequency of the qubit component is adjustable based on application of the optical signal to the Josephson junction circuitry.

12. The method of claim 10, further comprising:
forming the Josephson junction circuitry comprising a superconducting quantum interference device loop, wherein the cutout section of the ground plane enables access of a magnetic flux to the superconducting quantum interference device loop, and wherein a frequency of the qubit component is adjustable based on application of the magnetic flux to the superconducting quantum interference device loop by a coil device.

13. The method of claim 10, wherein the qubit component is associated with a first ground plane situated on a first surface of the qubit chip package, wherein the ground plane situated on the surface of the qubit chip package is a second ground plane situated on a second surface of the qubit chip package, wherein the second ground plane is embedded in the substrate, and wherein the second surface is on an opposite side of the qubit chip package from the first surface.

14. The method of claim 13, further comprising:
forming a capacitor component that is associated with the Josephson junction circuitry and is part of the qubit component, wherein the remaining portion of the second ground plane is positioned over at least a portion of the capacitor component.

15. The method of claim 13, wherein the substrate is a first substrate that provides support to the qubit chip package, and wherein the method further comprises:
forming a first set of through-vias in the qubit chip package;
forming an interposer component that comprises a second set of through-vias and is associated with a second substrate that provides support to the interposer component; and
forming a set of bump bonds that connect the interposer component to the qubit chip package.

16. A qubit device, comprising:
a qubit chip package, comprising:
a qubit component formed on a substrate component, wherein the qubit component comprises a Josephson junction component that is offset by a defined amount from a center region of the qubit component; and
a ground plane component situated on a surface of the qubit chip package,
wherein a cutout portion is formed in, and defined by a remaining portion of, the ground plane component and is situated over the Josephson junction component.

17. The qubit device of claim 16, wherein the cutout portion of the ground plane component enables access of an optical signal to the Josephson junction component to facilitate adjustment of a frequency of the qubit component based on application of the optical signal to the Josephson junction component.

18. The qubit device of claim 16, wherein the Josephson junction component comprises a superconducting quantum interference device loop, and wherein the cutout portion of the ground plane component enables access of a magnetic flux to the superconducting quantum interference device loop to facilitate adjustment of a frequency of the qubit component based on application of the magnetic flux to the superconducting quantum interference device loop by a coil component.

19. The qubit device of claim 16, wherein the qubit component is associated with a first ground plane component situated on a first surface of the qubit chip package, wherein the ground plane component situated on the surface of the qubit chip package is a second ground plane component situated on a second surface of the qubit chip package, wherein the second ground plane component is embedded in the substrate component, and wherein the second surface is on an opposite side of the qubit chip package from the first surface.

20. The qubit device of claim 19, wherein the substrate component is a first handler component that provides support to the qubit chip package, wherein the qubit chip package comprises a first set of through-vias, and wherein the qubit device further comprises:
a capacitor component that is associated with the Josephson junction component and is part of the qubit component, wherein the remaining portion of the second ground plane component is situated over at least a portion of the capacitor component;
an interposer component that comprises a second set of through-vias, wherein the interposer component is connected to the qubit chip package via a set of bump bond connectors; and
a second handler component that provides support to the interposer component.

* * * * *